US011329176B2

(12) United States Patent
Tourino et al.

(10) Patent No.: US 11,329,176 B2
(45) Date of Patent: *May 10, 2022

(54) RELIABLE INTERCONNECTION OF SOLAR CELLS

(71) Applicant: SolAero Technologies Corp., Albuquerque, NM (US)

(72) Inventors: Cory Tourino, Edgewood, NM (US); Kenneth Craymer, Albuquerque, NM (US); Anthony Sandoval, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 295 days.

This patent is subject to a terminal disclaimer.

(21) Appl. No.: 16/595,784

(22) Filed: Oct. 8, 2019

(65) Prior Publication Data

US 2020/0044103 A1  Feb. 6, 2020

Related U.S. Application Data

(62) Division of application No. 15/584,847, filed on May 2, 2017, now Pat. No. 10,658,533, which is a division of application No. 14/821,113, filed on Aug. 7, 2015, now abandoned.

(51) Int. Cl.
| | | |
|---|---|---|
| *H01L 31/044* | (2014.01) | |
| *H01L 31/05* | (2014.01) | |
| *H01L 31/048* | (2014.01) | |
| *H01L 31/0687* | (2012.01) | |

(52) U.S. Cl.
CPC .......... *H01L 31/044* (2014.12); *H01L 31/048* (2013.01); *H01L 31/0504* (2013.01); *H01L 31/0508* (2013.01); *H01L 31/0687* (2013.01); *Y02E 10/544* (2013.01); *Y02P 70/50* (2015.11)

(58) Field of Classification Search
None
See application file for complete search history.

(56) References Cited

U.S. PATENT DOCUMENTS 10,074,761 B2 * 9/2018 Hilgarth .............. H01L 31/0504

FOREIGN PATENT DOCUMENTS

| JP | 2001030999 A | 2/2001 |
| JP | 2013138109 A | 7/2013 |
| JP | 2019214599 A | 10/2013 |
| JP | 2015058468 A | 3/2015 |

OTHER PUBLICATIONS

Office Action for Japanese Patent Application No. 2016-076940 dated Jan. 9, 2020, 3 pages.

* cited by examiner

*Primary Examiner* — Daniel P Malley, Jr.

(57) ABSTRACT

The present disclosure provides interconnect elements and methods of using interconnect elements. In one embodiment, the interconnect element includes: a first end including at least three members, each member having a pair of parallel gap weld positions for mounting an adjoining first component; a second opposing end including at least two members, each member having a pair of parallel gap weld positions for mounting an adjoining second component; and one or more interconnect connecting portions to attach the first end of the interconnect element to the second end of the interconnect element.

17 Claims, 33 Drawing Sheets

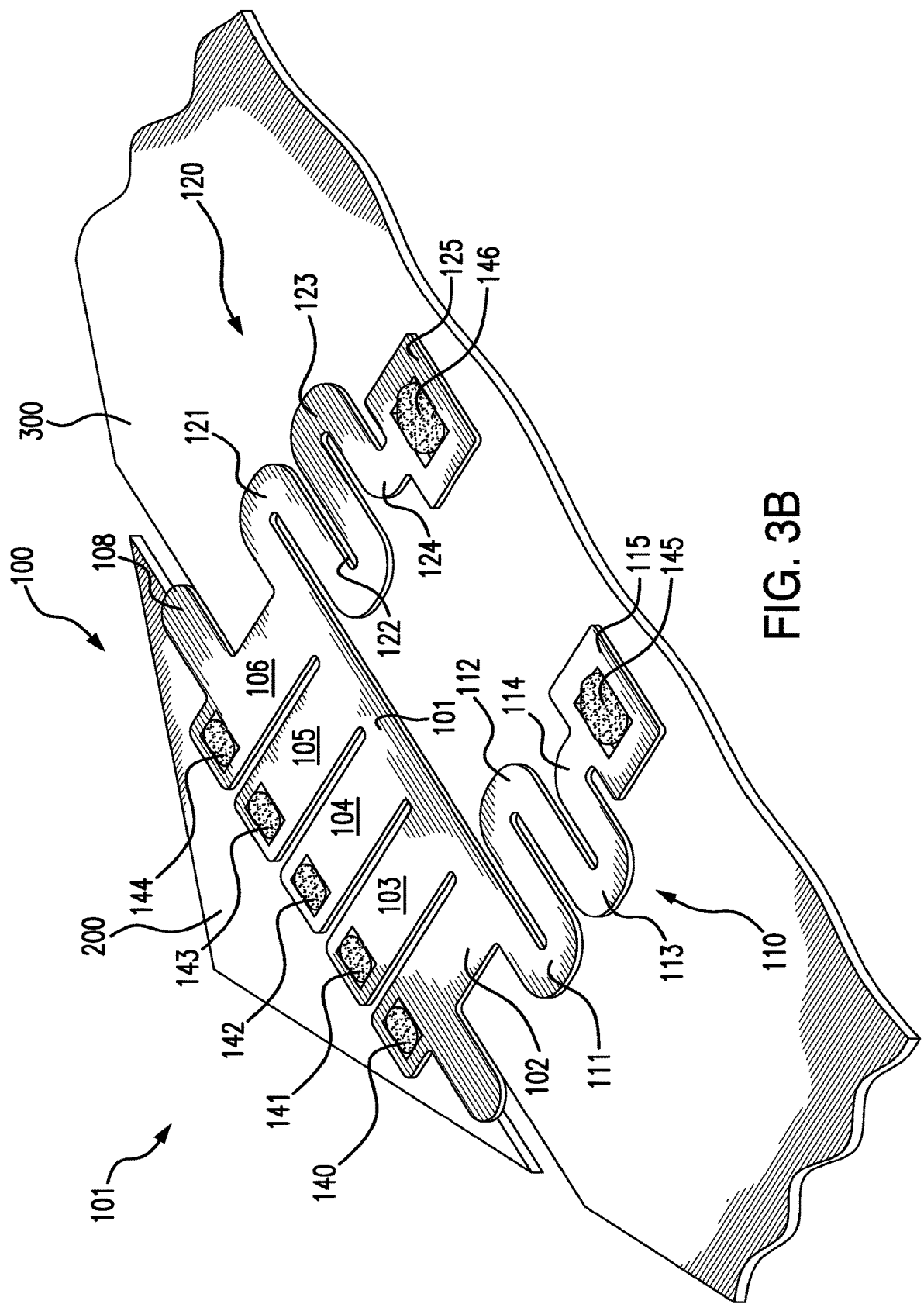

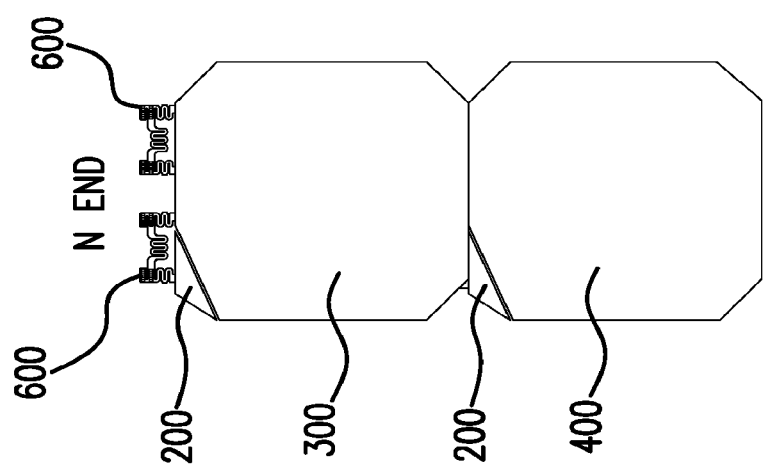

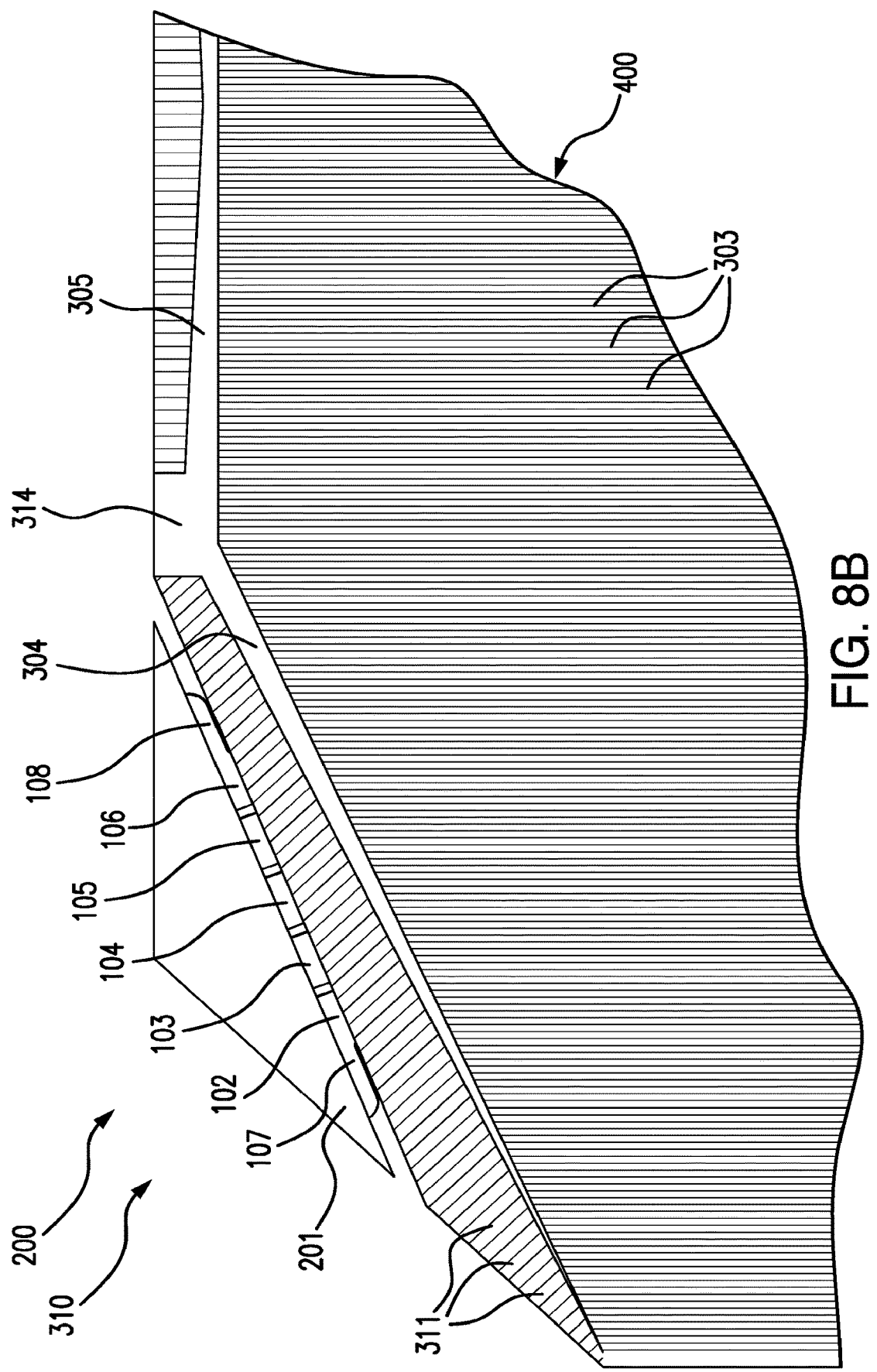

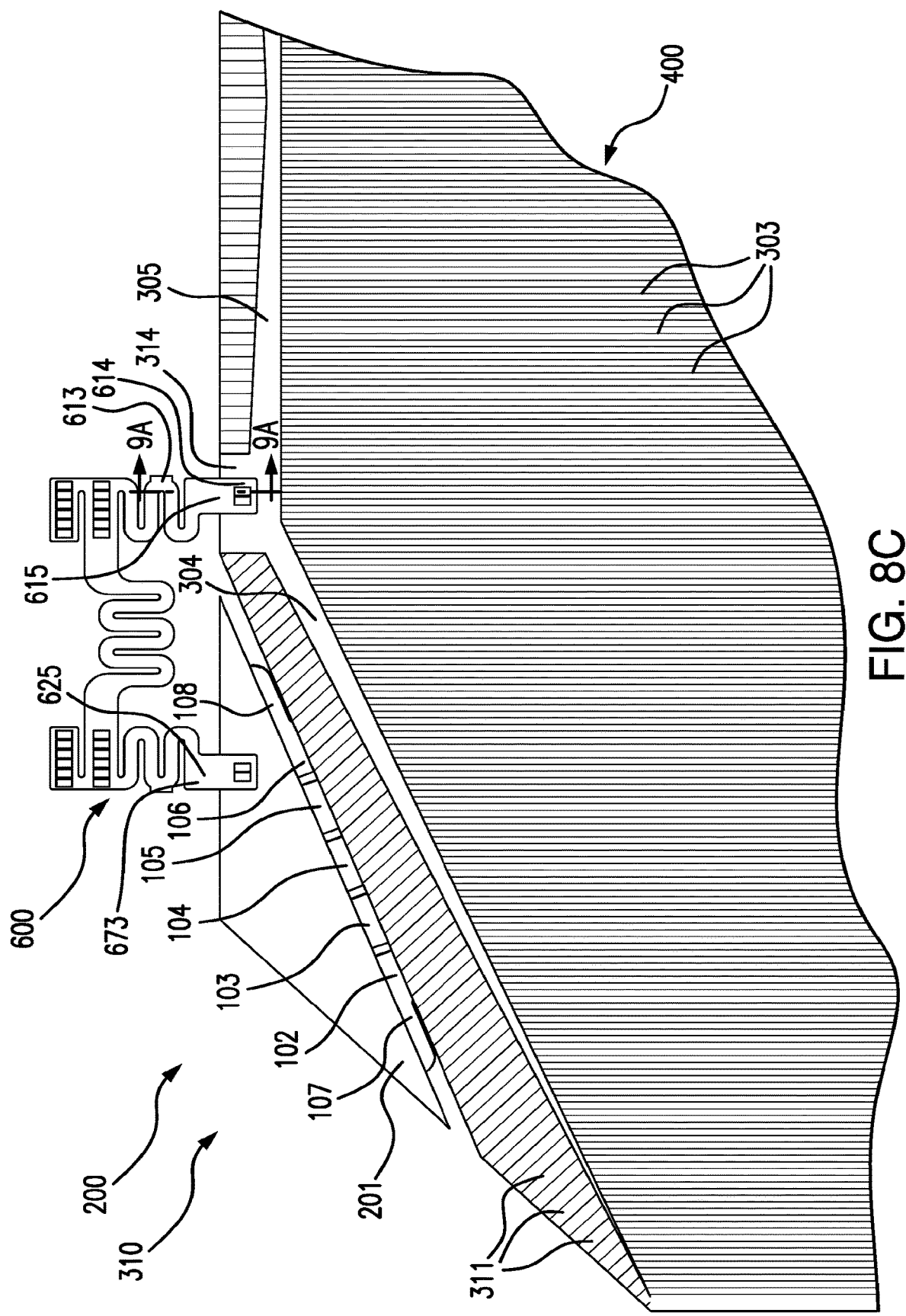

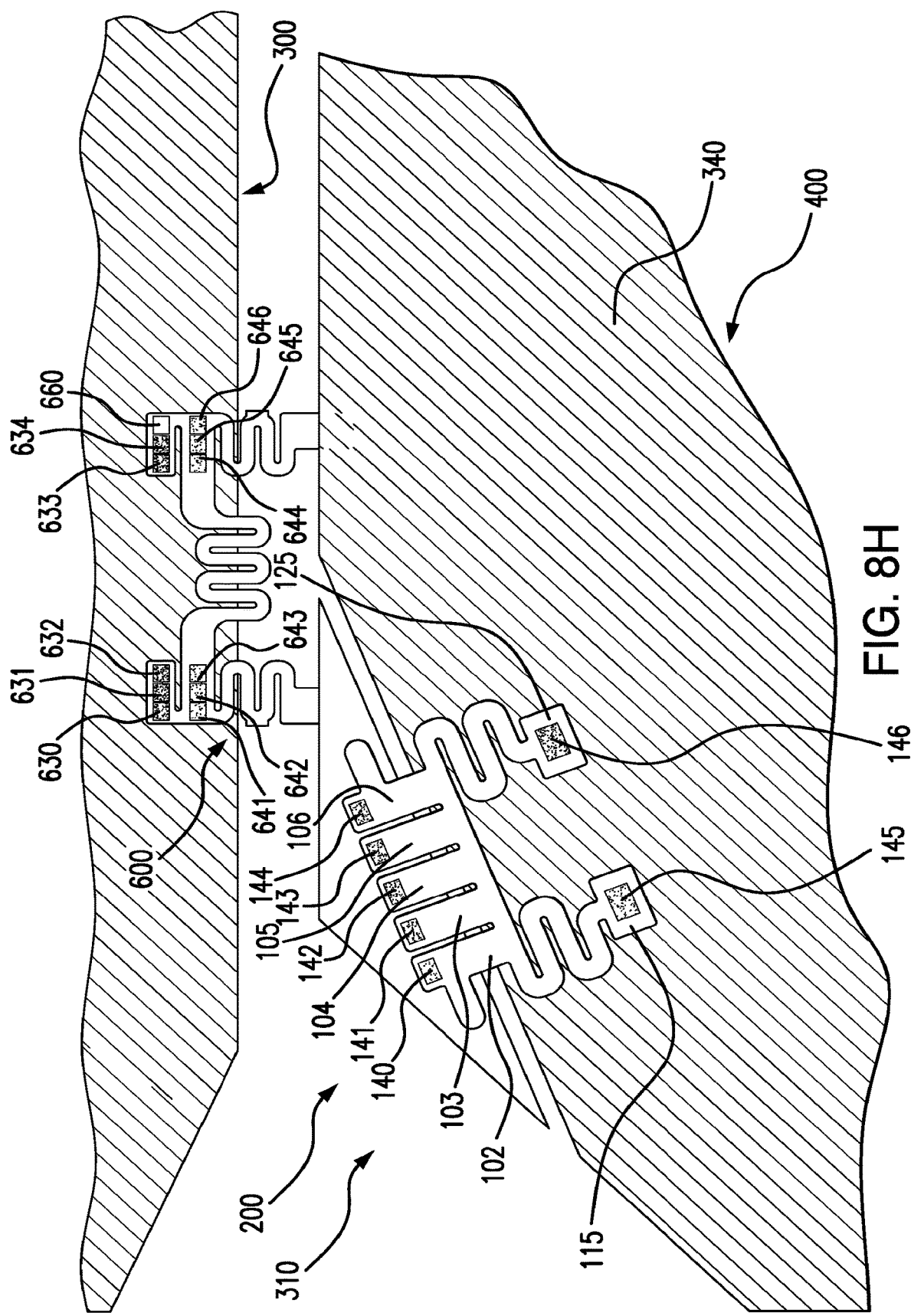

RELIABLE INTERCONNECTION OF SOLAR CELLS

REFERENCE TO RELATED APPLICATIONS

This application is a divisional of U.S. patent application Ser. No. 15/584,847, filed May 2, 2017, now U.S. Pat. No. 10,685,533, which in turn is a divisional of U.S. patent application Ser. No. 14/821,113, filed Aug. 7, 2015.

This application is also related to U.S. patent application Ser. No. 14/602,892 filed Jan. 22, 2015, Ser. No. 29/526,426 filed May 8, 2015, now U.S. Pat. D777,659 and Ser. No. 29/526,674 filed May 12, 2015, now U.S. Pat. D777,660 and Ser. No. 29/587,065 filed Dec. 9, 2016, now U.S. Pat. D816,603.

All of the above applications are hereby incorporated by reference.

BACKGROUND OF THE DISCLOSURE

1. Field of the Invention

The present invention relates to the field of photoelectric solar cell arrays, and to fabrication processes utilizing, for example, multijunction solar cells based on III-V semiconductor compounds fabricated into interconnected solar cell strings including discrete bypass diodes.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Sometimes, the individual solar cells are rectangular, and often square. Photovoltaic modules, arrays and devices including one or more solar cells may also be substantially rectangular, for example, based on an array of individual solar cells. Arrays of substantially circular solar cells are known to involve the drawback of inefficient use of the surface on which the solar cells are mounted, due to space that is not covered by the circular solar cells due to the space that is left between adjacent solar cells due to their circular configuration.

However, solar cells are often produced from circular or substantially circular wafers. For example, solar cells for space applications are typically multi-junction solar cells grown on substantially circular wafers. These circular wafers are sometimes 100 mm or 150 mm diameter wafers. However, as explained above, for assembly into a solar array (henceforth, also referred to as a solar cell panel), the circular wafers are often divided into other form factors to make solar cells. One preferable form factor for a solar cell for space is a rectangle, such as a square, which allows for the area of a rectangular panel consisting of an array of solar cells to be filled 100%, assuming that there is no space between the adjacent rectangular solar cells.

Space applications frequently use high efficiency solar cells, including multijunction solar cells based on III-V compound semiconductors. High efficiency solar cell wafers are often costly to produce. Thus, the waste has conventionally been accepted in the art as the price to pay for a high fill factor, that is, the waste that is the result of cutting the rectangular solar cell out of the substantially circular solar cell wafer can incur a considerable cost.

One method of reducing waste is by using solar cells having oblique cut corners, also referred to as cropped corners. Solar cells with cropped corners can be obtained from a substantially circular solar cell wafer, which allows a substantial part of the wafer to be used for the production of a substantially octagonal solar cell. As the four oblique sides at the corners are shorter than the other four sides, the general layout of the solar cell is substantially rectangular or square, and a high coverage factor is obtained when the solar cells are placed in an array to provide a substantially rectangular solar cell array. Some space is wasted at the corners of the solar cells, as the space where the solar cells meet at the cropped corners will not be used for the conversion of solar energy into electrical energy. However, this wasted space amounts to a relatively small portion of the entire space occupied by the solar cell array and typically can be used to house other components of the solar cell assembly, such as bypass diodes.

Bypass diodes are frequently used for each solar cell in solar cell arrays comprising a plurality of series connected solar cells or groups of solar cells. One reason for this is that if one of the solar cells or groups of solar cells is shaded or damaged, current produced by other solar cells, such as by unshaded or undamaged solar cells or groups of solar cells, can flow through the bypass diode, and thus avoid the high resistance of the shaded or damaged solar cell or group of solar cells. Placing the bypass diodes at the cropped corners of the solar cells can lead to increased efficiency, because the bypass diodes make use of a space that is not used for converting solar energy into electrical energy. As a solar cell array or solar panel often includes a large number of solar cells, and often a correspondingly large number of bypass diodes, the efficient use of the area at the cropped corners of individual solar cells can represent an important enhancement of the efficient use of space in the overall solar cell assembly.

SUMMARY OF THE DISCLOSURE

1. Objects of the Disclosure

It is an object of the present disclosure to provide interconnects and methods of using interconnects that can provide for improved manufacturability and/or reliability in multijunction solar cell assemblies.

Some implementations of the present disclosure may incorporate or implement fewer of the aspects and features noted in the foregoing objects.

2. Features of the Disclosure

In one aspect, the present disclosure provides interconnect elements and methods of using interconnect elements.

In one embodiment, the interconnect element includes: a first end including at least three members (e.g., 3, 4, 5, or more members), each member having a pair of parallel gap apertures for mounting an adjoining first component; a second opposing end including at least two members, each member having a pair of parallel gap apertures for mounting an adjoining second component; and one or more interconnect connecting portions to attach the first end of the interconnect element to the second end of the interconnect element. Optionally, the interconnect connecting portions can be curved.

In another embodiment, the interconnect element includes a first end comprising at least two members, each member having two sets of three pairs of parallel gap apertures for mounting an adjoining first component, wherein the at least two members are attached to one another by one or more member connecting portions; a second opposing end comprising at least two members, each member having a pair of parallel gap apertures for mounting an adjoining second component; and one or more interconnect connecting portions to attach the first end of the interconnect element to the second end of the interconnect element. Optionally, the member connecting portions and/or the interconnect connecting portions can be curved.

Briefly, and in general terms, the present disclosure provides a method of making an interconnection between a solar cell and an adjoining discrete bypass diode comprising: providing a solar cell comprising a top surface including a contact of a first polarity type disposed along the first peripheral edge thereof, and a rear surface including a contact of a second polarity type, providing a bypass diode comprising a top surface including a contact of a first polarity type, and a rear surface including a contact of a second polarity type, providing a metallic first interconnect element and aligning it with respect to the solar cell and the bypass diode so that one end of the interconnect element extends over a portion of the rear surface of the solar cell, and the opposing end of the interconnect element extends over a portion of the rear surface of the bypass diode; welding the first interconnect element to the rear surface of the bypass diode at a first weld point at the location of a pair of parallel gap apertures at the one end of the interconnect element that extends over a portion of the rear surface of the bypass diode; welding the first interconnect element to the rear surface of the bypass diode at a second weld point at the location of a pair of parallel gap apertures at the one end of the interconnect element that extends over a portion of the rear surface of the bypass diode; welding the interconnect element to a portion of the rear surface of the solar cell at a first weld point at the location of a pair of parallel gap apertures at the one end of the interconnect element that extends over a portion of the rear surface of the solar cell; and welding the interconnect element to a portion of the rear surface of the solar cell at a second weld point at the location of a pair of parallel gap apertures at the one end of the interconnect element that extends over a portion of the rear surface of the solar cell.

In some implementations, a method of making an interconnection between a solar cell and an adjoining discrete bypass diode includes providing a solar cell and providing a bypass diode. The solar cell includes a top surface including a contact of a first polarity type disposed along a first peripheral edge thereof, and a rear surface including a contact of a second polarity type. The bypass diode includes a top surface including a contact of a first polarity type, and a rear surface including a contact of a second polarity type. The method further includes providing a metallic first interconnect element comprising a first end, a second opposing end, and one or more interconnect connecting portions attaching the first end of the interconnect element to the second opposing end of the interconnect element; wherein the first end comprises at least two first end members and one or more member connecting portions, each first end member having a respective first set of three pairs of parallel gap weld positions adapted for use in a parallel gap welding process for mounting the adjoining bypass diode to the interconnect element, and a respective second set of three pairs of parallel gap weld positions wherein the second set of weld positions is disposed parallel to and laterally spaced away from the first set of three pairs of weld positions and adapted for use, as an alternative to the first set, for mounting the adjoining bypass diode to the interconnect element. The at least two first end members are attached to one another by the one or more member connecting portions; and wherein the second opposing end comprises at least two opposing end members, each opposing end member having a respective pair of parallel gap weld positions adapted for use in a parallel gap welding process for mounting the adjoining solar cell to the interconnect element. The method also includes aligning the metallic first interconnect element with respect to the solar cell and the bypass diode so that the second opposing end of the interconnect element extends over a portion of the rear surface of the solar cell, and the first end of the interconnect element extends over a portion of the rear surface of the bypass diode. The first interconnect element is welded to the rear surface of the bypass diode at a first weld point at a location of a first one of the pairs of parallel gap weld positions adapted for use in a parallel gap welding process at the first end of the interconnect element that extends over a portion of the rear surface of the bypass diode. The first interconnect element is welded to the rear surface of the bypass diode at a second weld point at a location of a second one of the pairs of parallel gap positions adapted for use in a parallel gap welding process at the first end of the interconnect element that extends over a portion of the rear surface of the bypass diode. The first interconnect element is welded to a portion of the rear surface of the solar cell at a first weld point at a location of a first one of the pairs of parallel gap weld positions adapted for use in a parallel gap welding process at the second opposing end of the interconnect element that extends over a portion of the rear surface of the solar cell. The first interconnect element also is welded to a portion of the rear surface of the solar cell at a second weld point at a location of a second one of the pairs of parallel gap weld positions adapted for use in a parallel gap welding process at the second opposing end of the interconnect element that extends over a portion of the rear surface of the solar cell.

In some embodiments, the method further comprises providing a metallic second interconnect element and aligning it with respect to the solar cell and the bypass diode so that the first end of the second interconnect element extends over a portion of the top surface of the solar cell, and the opposing second end of the second interconnect element extends over a portion of the top surface of the bypass diode.

In some embodiments, the method further comprises welding the second interconnect element to the top surface of the solar cell at the location of a pair of parallel gap apertures at a first end portion of the second interconnect element that extends over a portion of the top surface of the solar cell.

In some embodiments, the method further comprises welding the second interconnect element to the top surface of the bypass diode at the location of a pair of parallel gap apertures at a second opposing end portion of the second interconnect element that extends over a portion of the top surface of the bypass diode.

In some embodiments, the method further comprises bonding a cover glass over the top surface of the solar cell, the bypass diode, and a first portion of the second interconnect element using an adhesive, wherein a second portion of the second interconnect element extends outside of the edge of the cover glass to allow the second interconnect element to be bonded to an adjoining solar cell.

In some embodiments, the second portion of the second interconnect element includes a first bonding pad at one end corner of the second interconnect element, and a second bonding pad at a second opposing end corner of the second interconnect element.

In some embodiments, the first bonding pad includes a pair of parallel gap apertures at a first end corner of the second interconnect element, and the second bonding pad includes a pair of parallel gap apertures at the second opposing end corner of the second interconnect element.

In some embodiments, the second portion of the second interconnect element includes a third bonding pad adjacent to the first bonding pad and disposed at one end corner of the second interconnect element and including a pair of parallel gap apertures, and a fourth bonding pad adjacent to the second bonding pad and disposed at the second opposing end corner of the second interconnect element and including a pair of parallel gap apertures.

In some embodiments of the disclosure, the bypass diode has a substantially triangular shape adapted to fit into a space left free by at least a portion of the cut corner. That is, the bypass diode can be fit into the space left free due to the absent corner, that is, the space that is formed between, for example, a linear contact member such as a linear bus bar, and the edge of the solar cell that is placed adjacent to the contact member.

In some embodiments of the disclosure, the bypass diode has a substantially triangular shape with two acute angles of about 22.5 degrees.

In some embodiments, the bonding layer is a metallic solder alloy film comprised of molybdenum, KOVAR™, or other Fe—Ni alloys a coefficient of thermal expansion (CTE) suitably matched to the CTE of the semiconductor.

KOVAR™ is a trademark of CRS Holdings, Inc. of Wilmington, Del., and is a nickel-cobalt ferrous alloy designed to be compatible with the thermal expansion characteristics of borosilicate glass in order to allow adjacent disposition of the KOVAR™ material and the glass to ensure reliable mechanical stability over a range of temperatures.

In some embodiments, the metallic layer is a solid metallic foil having a thickness between 0.001 and 0.005 inches.

In some embodiments, the solar cells are III-V compound semiconductor multijunction solar cells.

In some embodiments, the semiconductor solar cells have a thickness of less than 50 microns.

In some embodiments, the solar cell assembly or glass interconnected cell (CIC) is about 140 microns in thickness.

In some embodiments, the bypass diodes are silicon semiconductor.

In some embodiments, the bypass diodes are 140 microns in thickness.

In another aspect, the present invention provides a solar cell array comprising a supporting substrate including a molybdenum, KOVAR™ or Fe—Ni alloy having a CTE suitably matched to the CTE of the semiconductor and having a thickness between 0.001 and 0.005 inches, and an array of solar cells mounted on the supporting substrate.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWING

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures:

FIG. 3B is a perspective view of the interconnect element of FIG. 1 with the welding apertures on the second opposing end of it having been welded to the adjoining second component so as to secure the interconnect element to the adjoining second component;

FIG. 8A is a top plan view of a portion of an array of solar cells that have been interconnected using the interconnect elements according to the present disclosure;

FIG. 8B is an enlarged top plan view of the left hand portion of a solar cell in the array shown in FIG. 8A showing a portion of the interconnect element to the bypass diode;

FIG. 8C is an enlarged top plan view of the left hand portion of the solar cell of FIG. 8B after placement of the interconnect element of FIG. 6 on the top surface of the bypass diode and one pad on the solar cell according to the present disclosure;

FIG. 8H is an enlarged bottom plan view of a portion of a solar cell shown in FIG. 8G showing the interconnect element of FIG. 6 after being reworked by welding of the second row of weld positions to the adjacent solar cell.

DESCRIPTION OF ILLUSTRATIVE EMBODIMENTS

Figure 1:
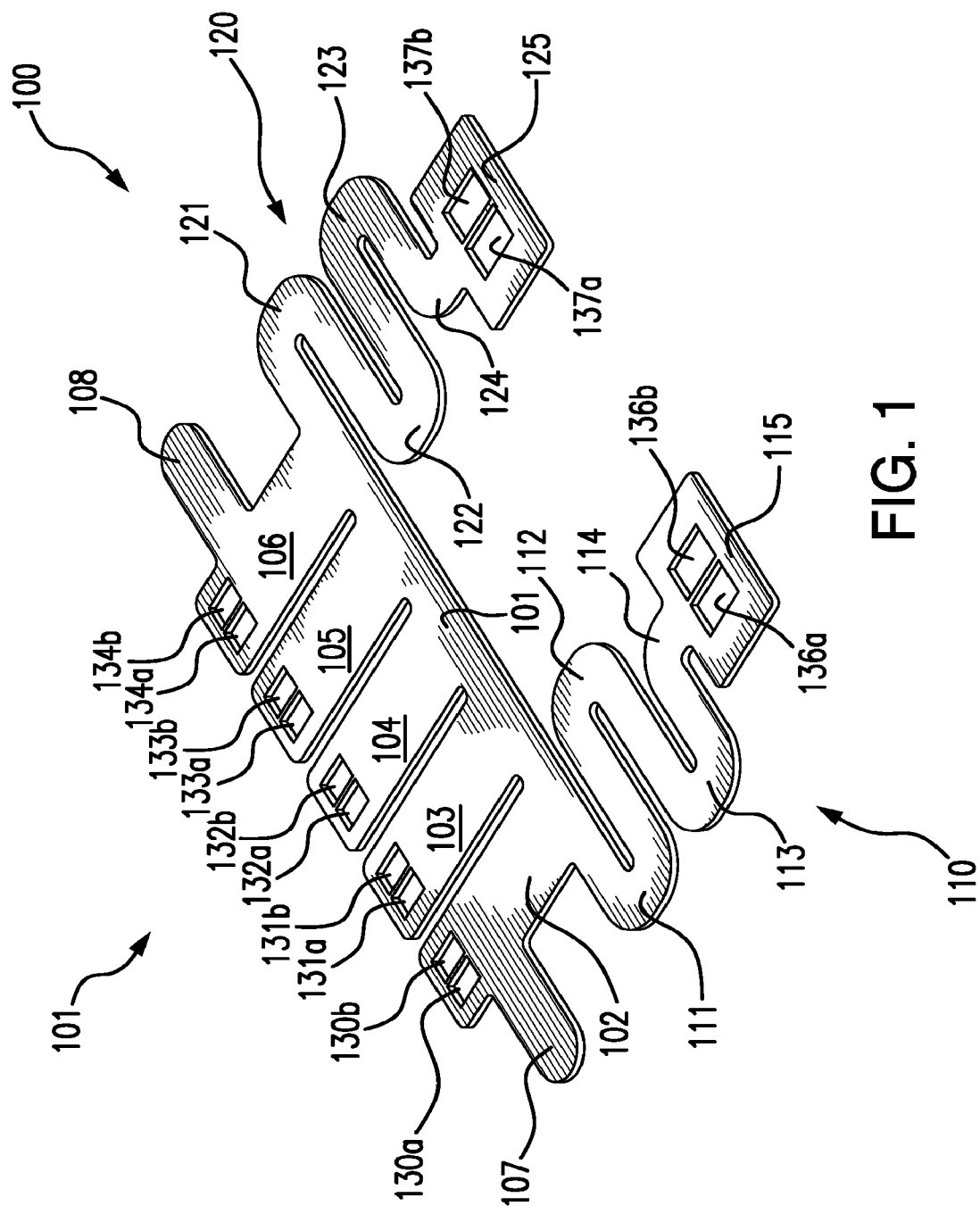
FIG. 1 is a perspective view of a first interconnect element for a solar cell according to the present disclosure.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and solar cell arrays are disclosed in the related applications noted above. Some, many or all of such features may be included in the structures and processes associated with the solar cells and interconnect elements of the present disclosure. However, more particularly, the present disclosure is directed to new embodiments of the interconnect element and the processes for attaching such interconnect elements to semiconductor devices.

The present disclosure provides a design of interconnect elements and a process for the fabrication of a "Cover glass-Interconnect-Cell" assembly or "CIC" using multijunction solar cells and interconnection between adjacent CICs that improve the reliability of such interconnections. More specifically, the present disclosure intends to provide a relatively simple and reproducible technique that is suitable for use in a high volume production environment in which specific interconnect elements are utilized, and subsequent processing steps are defined and selected to minimize any physical damage to solar cell and the bond, thereby ensuring a relatively high yield of operable CICs meeting specifications at the conclusion of the fabrication processes.

Prior to discussing the specific embodiments of the present disclosure, a brief discussion of some of the issues more generally associated with the design of multijunction solar cells, and in particular an array of such solar cells, and the context of the composition or deposition of various specific layers in embodiments of the semiconductor structure as specified and defined by Applicant in various related patent applications is in order.

There are a multitude of properties that should be considered in specifying and selecting the composition of, inter alia, a specific semiconductor layer, the back metal layer, the contacts, the adhesive or bonding material, the interconnect element material composition, size, and shape, or the composition of the substrate or supporting material for mounting a solar cell thereon and forming a finished panel. For example, some of the properties that should be considered when selecting a particular layer or material in the semiconductor device are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multi-junction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g., indium or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step."

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a perspective view of a first interconnect element 100 for a solar cell according to the present disclosure. First interconnect element 100 includes a first end 101 for mounting to an adjoining first component and a second opposing end including members 110 and 120 for mounting to an adjoining second component.

In the embodiment illustrated in FIG. 1, first end 101 includes five members 102, 103, 104, 105, and 106 each having a pair of parallel gap apertures 130a/130b, 131a/131b, 132a/132b, 133a/133b, and 134a/134b, respectively, for mounting to an adjoining first component. Member 102 also includes bonding pad 107, and member 106 includes bonding pad 108. First end 101 also includes portions 111 and 121 on opposing portions of first end 101 for connecting to the second opposing end of first interconnect element 100.

In the embodiment illustrated in FIG. 1, the second opposing end includes members 110 and 120. Member 110 includes portion 115 having a pair of parallel gap apertures 136a/136b, which is attached to portion 111 of first and 101 by interconnect connecting portions 112, 113, and 114 of member 110. Member 120 includes portion 125 having a pair of parallel gap apertures 137a/137b, which is attached to portion 121 of first end 101 by interconnect connecting portions 122, 123, and 124 of member 120. As illustrated in FIG. 1, interconnect connecting portions 112, 113, and 114 and interconnect connecting portions 122, 123, and 124 are depicted as curved portions which can provide, for example, some degree of flexibility in the final mounted structures.

Figure 2A:
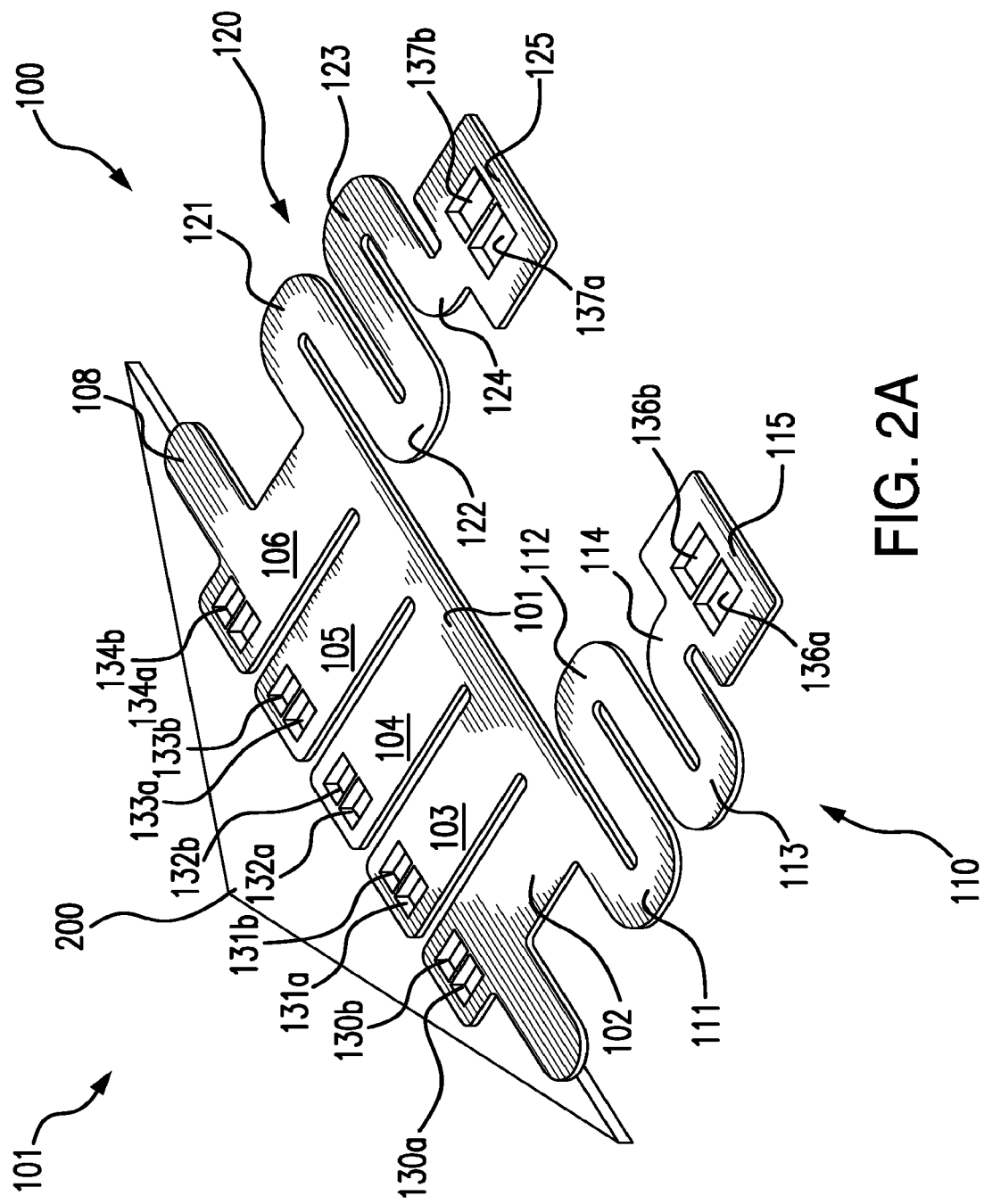
FIG. 2A is a perspective view of the interconnect element of FIG. 1 with a first end of it aligned for mounting to an adjoining first component.

FIG. 2A is a perspective view of interconnect element 100 of FIG. 1 with a first end 101 aligned for mounting to an adjoining first component 200. Specifically, pairs of parallel gap apertures 130a/130b, 131a/131b, 132a/132b, 133a/133b, and 134a/134b of members 102, 103, 104, 105, and 106, respectively, can provide five welding points for mounting first end 101 of the interconnect element 100 to the aligned adjoining first component 200.

Figure 2B:
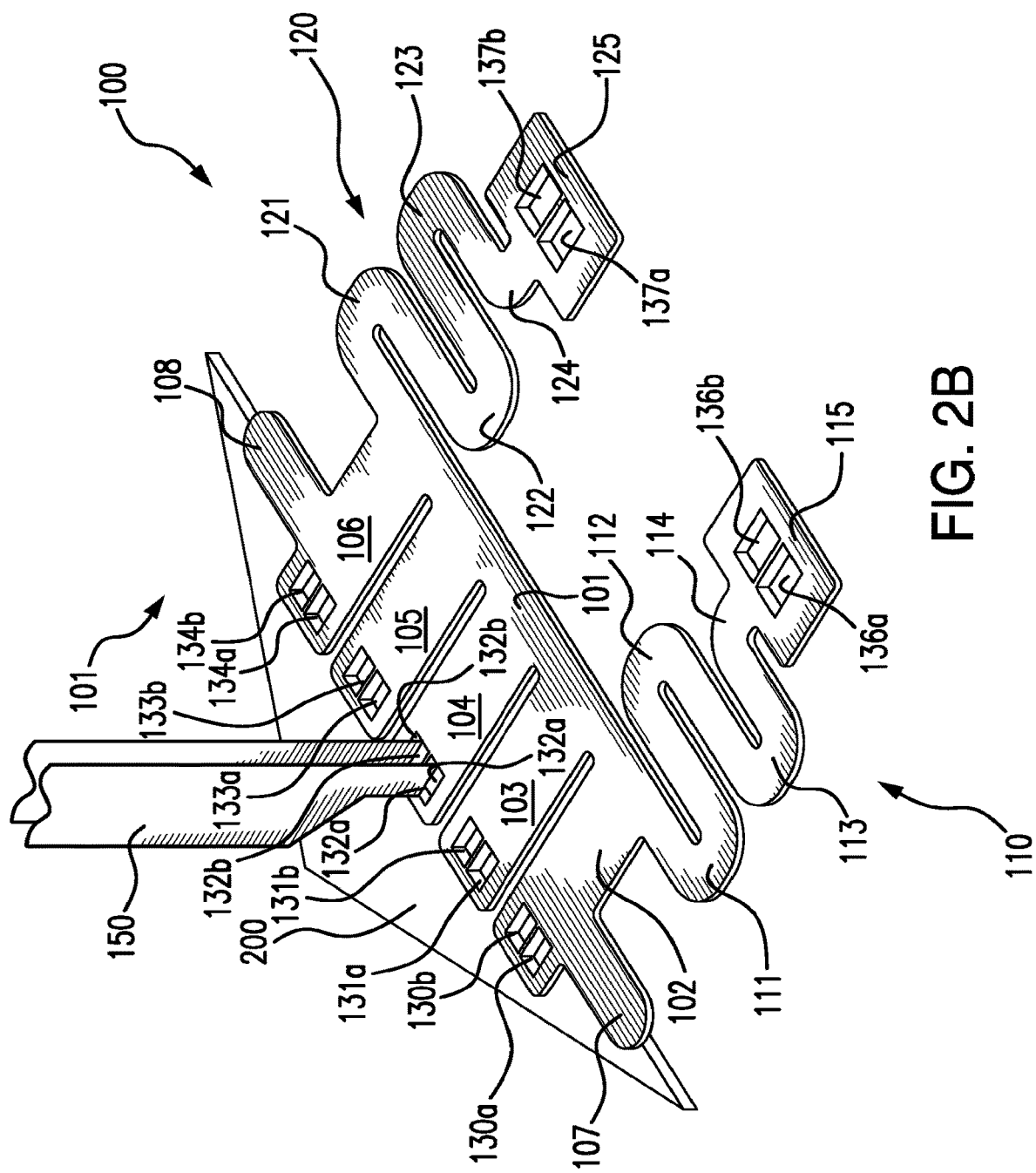
FIG. 2B is a perspective view of the interconnect element of FIG. 1 with a parallel gap welding tool being applied to one welding aperture on the first end of the interconnect.

FIG. 2B is a perspective view of interconnect element 100 of FIG. 1 with a parallel gap welding tool 150 being applied to the pair of parallel gap apertures 132a/132b to weld member 104 of the first end 101 of the first interconnect element 100 to the aligned adjoining first component 200.

Figure 2C:
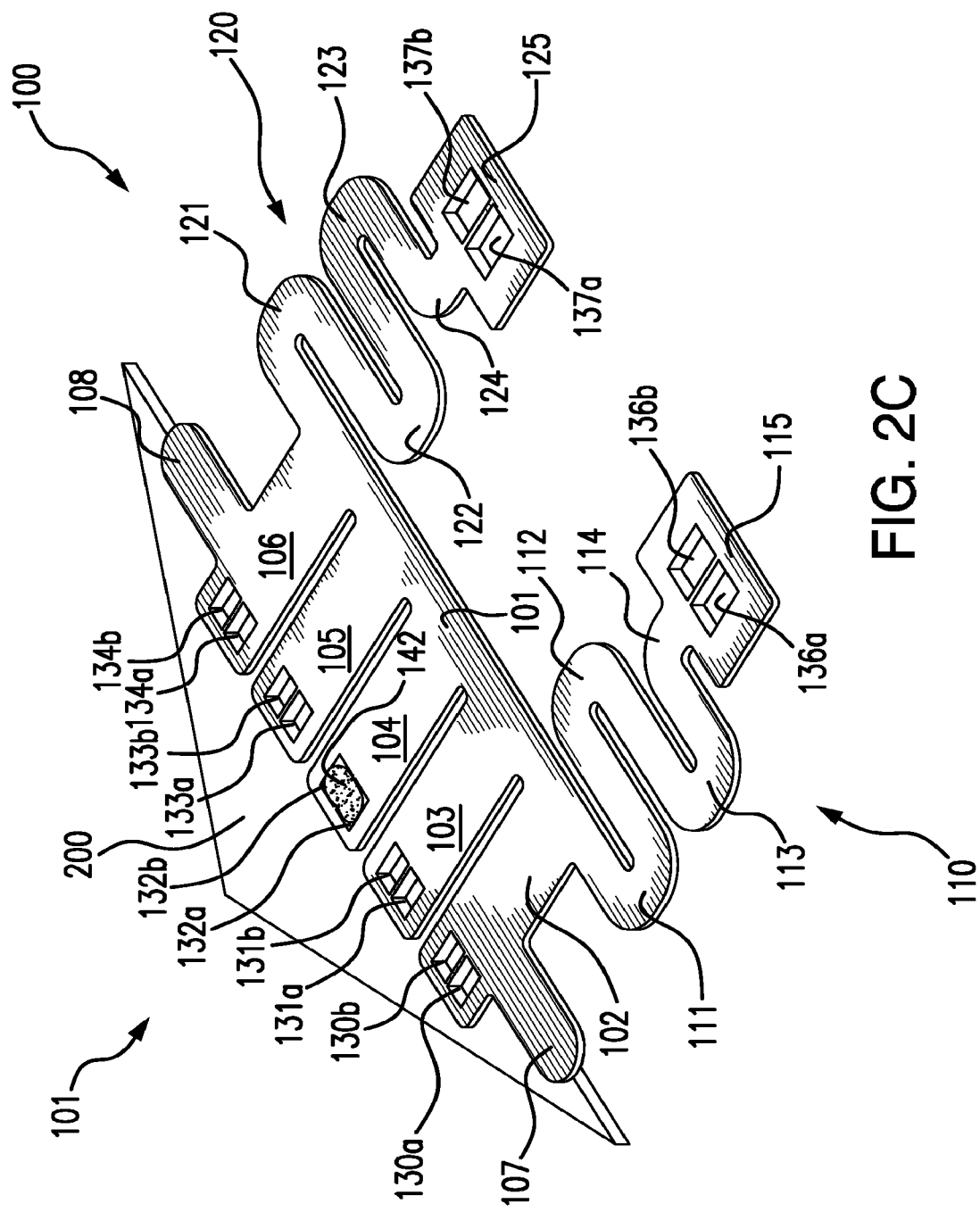
FIG. 2C is a perspective view of the interconnect element of FIG. 1 with the one welding aperture having been welded so as to secure the interconnect element to the adjoining first component.

FIG. 2C is a perspective view of interconnect element 100 of FIG. 1 with the pair of parallel gap aperture 132a/132b of member 104 of the first end 101 of the first interconnect element 100 having been welded at weld point 142 to the aligned adjoining first component 200 so as to secure the first end 101 of interconnect element 100 to the adjoining first component 200.

Figure 2D:
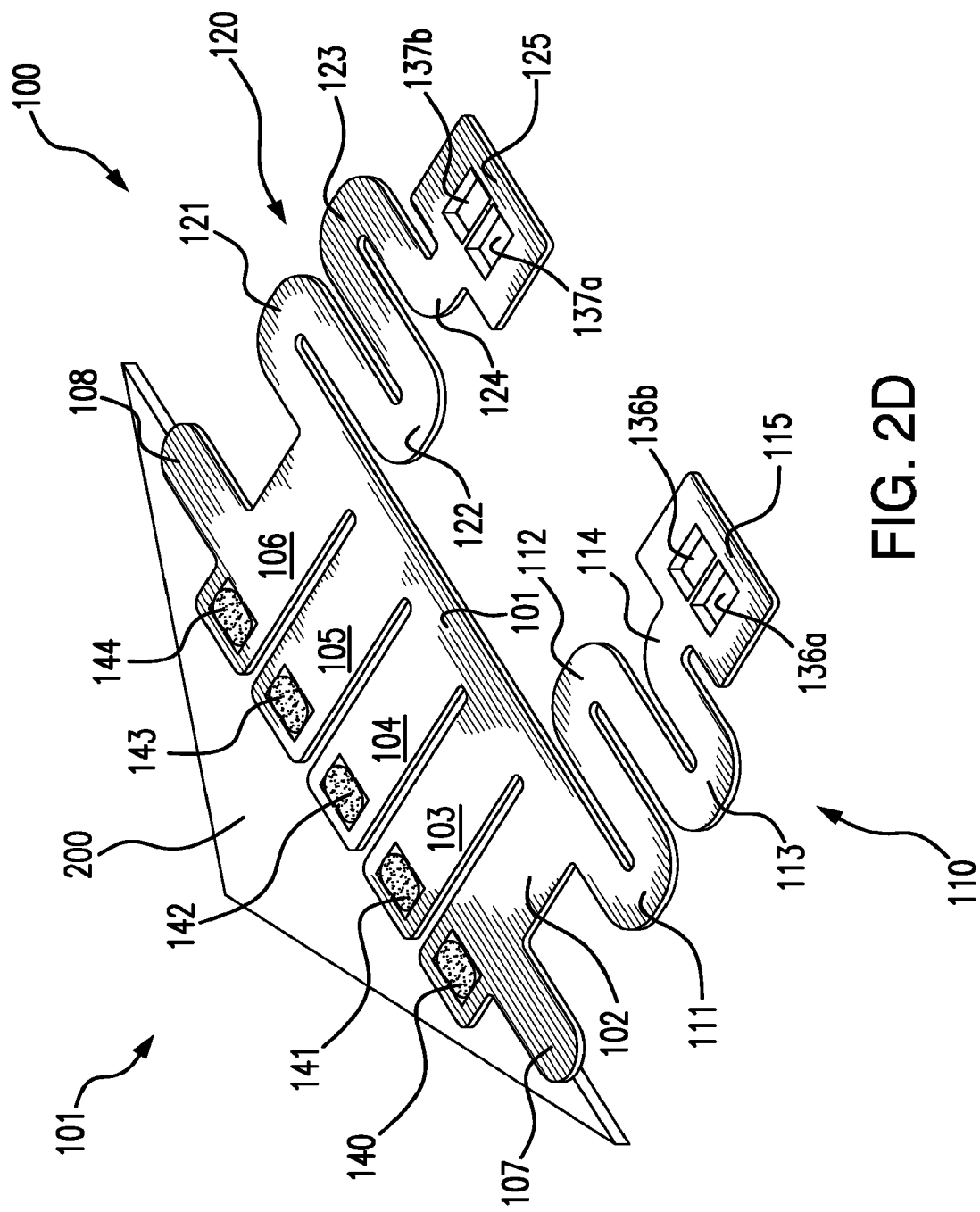
FIG. 2D is a perspective view of the interconnect element of FIG. 1 with all of the welding apertures having been welded so as to secure the interconnect element to the adjoining first component.

FIG. 2D is a perspective view of interconnect element 100 of FIG. 1 with pairs of parallel gap apertures 130a/130b, 131a/131b, 132a/132b, 133a/133b, and 134a/134b of members 102, 103, 104, 105, and 106, respectively, having all been welded at five weld points 140, 141, 142, 143, and 144 to the aligned adjoining first component 200 to provide five welding points for securing the first end 101 of interconnect element 100 to the adjoining first component 200.

Interconnect elements as disclosed herein have one end with sufficient pairs of parallel apertures to form at least three weld points, and in some embodiments, four, five, or even more weld points for attaching the interconnect to a first adjoining component. Multiple weld points are particularly useful for components such as bypass diodes, where lesser numbers of weld points can result in unacceptable number of failures during manufacture and/or environmental aging.

Figure 3A:
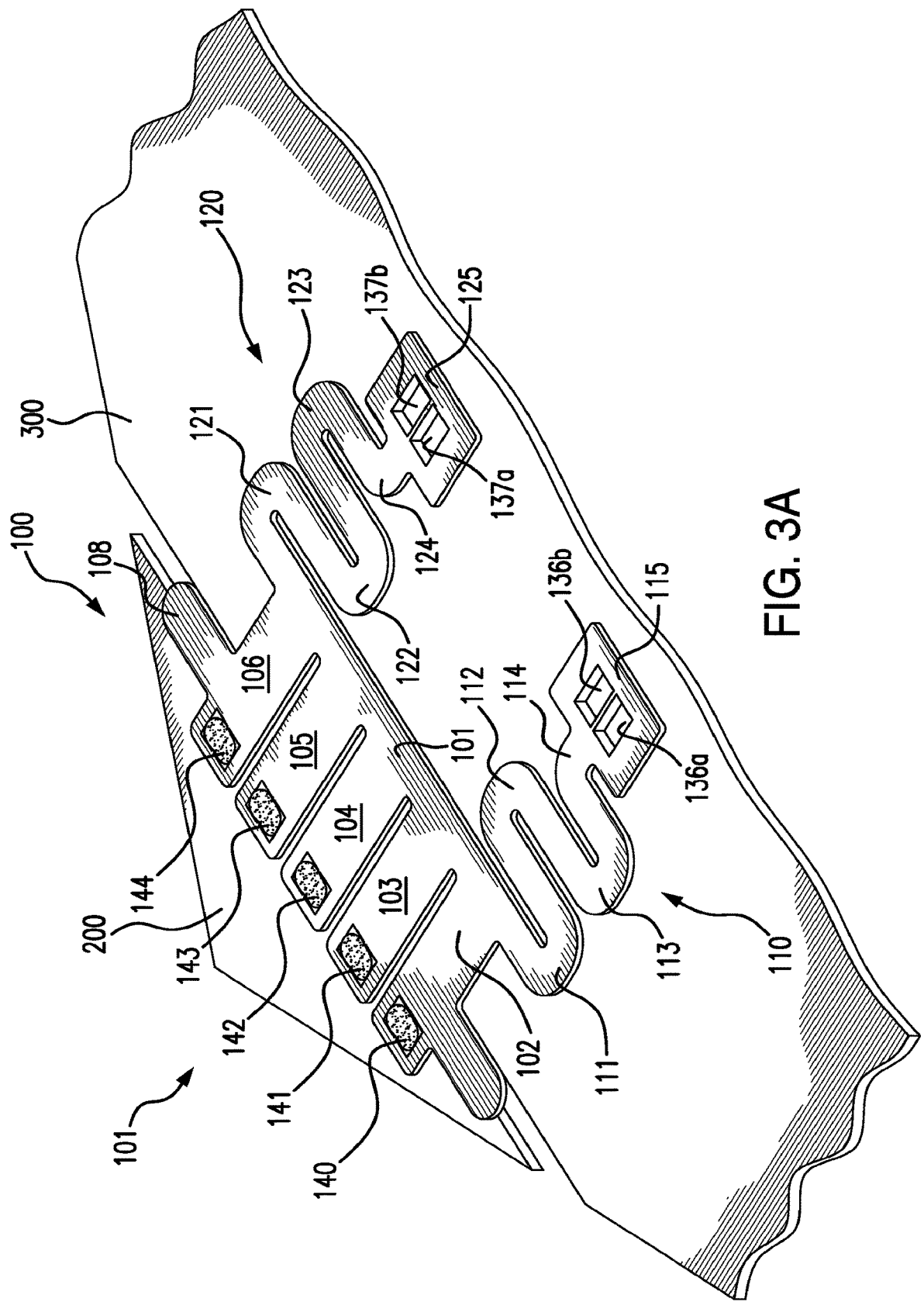
FIG. 3A is a perspective view of the interconnect element of FIG. 1 with a second opposing end of it aligned for mounting to an adjoining second component.

FIG. 3A is a perspective view of interconnect element 100 of FIG. 1 with the second opposing end including members 110 and 120 aligned for mounting to an adjoining second component 300. Specifically, the pair of parallel gap apertures 136a/136b in portion 115 of member 110, and the pair of parallel gap apertures 137a/137b in portion 125 of member 120 can provide two welding points for mounting the opposing second end of interconnect element 100 to the aligned adjoining second component 300. A parallel gap welding tool 150 can be applied to pairs of parallel gap apertures in a manner similar to that illustrated in FIG. 2B to weld the opposing second end of interconnect element 100 to the aligned adjoining second component 300.

FIG. 3B is a perspective view of interconnect element 100 of FIG. 1 with the pairs of parallel gap apertures 136a/136b and 137a/137b on members 110 and 120 of the second opposing end of interconnect element 100 having been welded at two weld points 145 and 146, respectively, to the adjoining second component 300 so as to secure the second opposing end of interconnect element 100 to the adjoining second component.

Interconnect elements as disclosed herein have a second end with sufficient pairs of parallel apertures to form at least two weld points, and in some embodiments, three, four, five, or even more weld points for attaching the interconnect to a second adjoining component. Multiple weld points are particularly useful for components such as solar cells, where lesser numbers of weld points can result in unacceptable number of failures during manufacture and/or environmental aging.

Figure 4A:
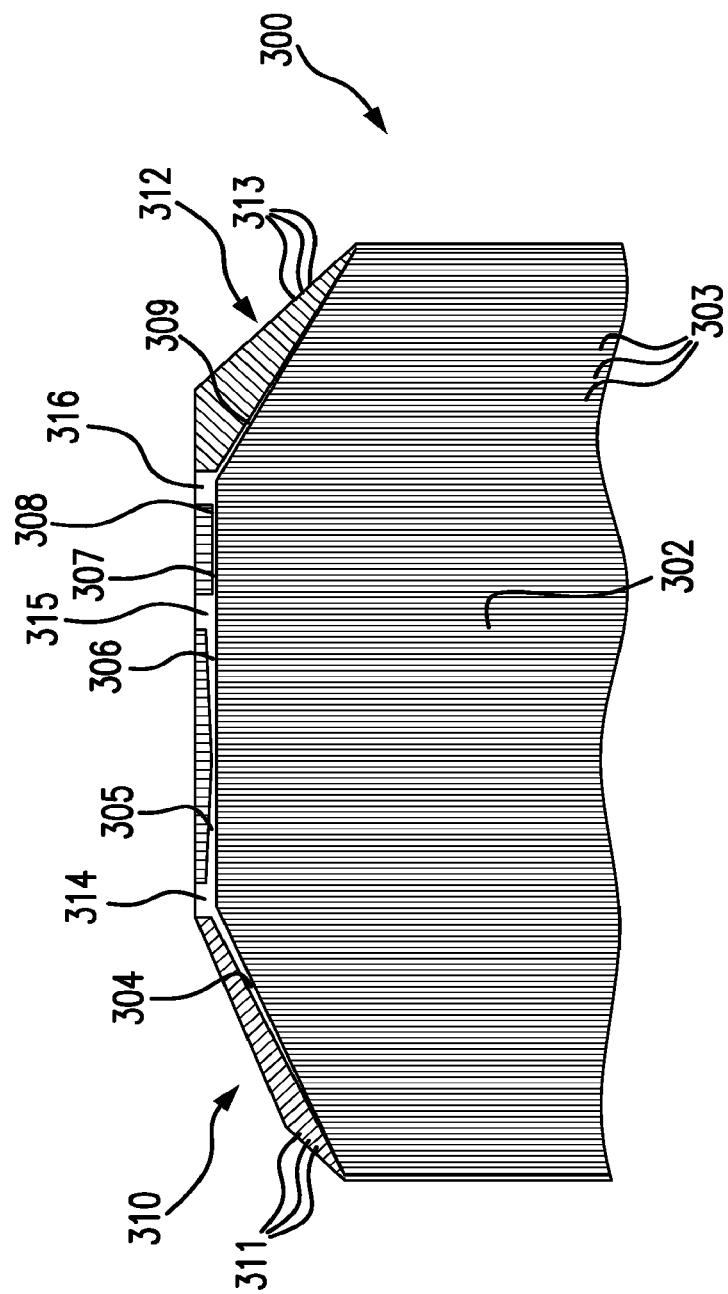
FIG. 4A is a top plan view of a portion of a solar cell with cropped corners according to the present disclosure.

FIG. 4A illustrates the upper or top side 302 of a solar cell 300 with cropped corners 310 and 312, including a portion 310 which is cropped a second time and where a bypass diode is to be placed. Grid lines 303 are present at the upper side to collect the generated current, and are connected to a bus bar 304, 305, 306, 307, 308, and 309, which includes contact pads 314, 315, and 316 disposed on the top surface at an edge of the solar cell. Wider spaced grid lines 311 and 313 are coupled to bus bar 304 and 309 respectively, to collect current from the active cell area.

Figure 4B:
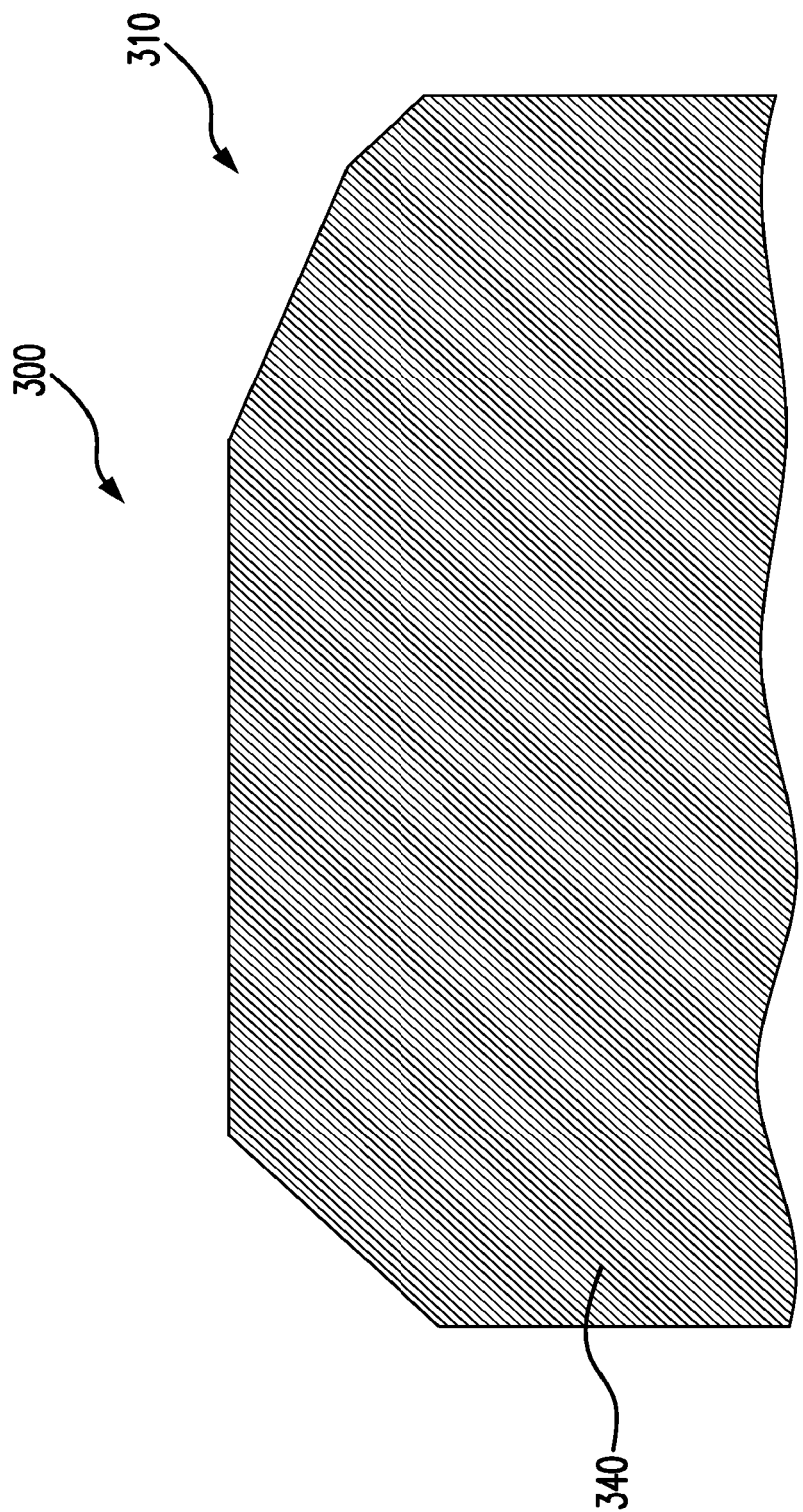
FIG. 4B is a bottom plan view of a portion of a solar cell with cropped corners according to the present disclosure.

FIG. 4B illustrates the bottom or back side of the solar cell of FIG. 4A, which is provided with a metal layer 340 covering the entire bottom side of the solar cell 300, which includes a portion 310 which is cropped a second time and where a bypass diode is to be placed.

Figure 4C:
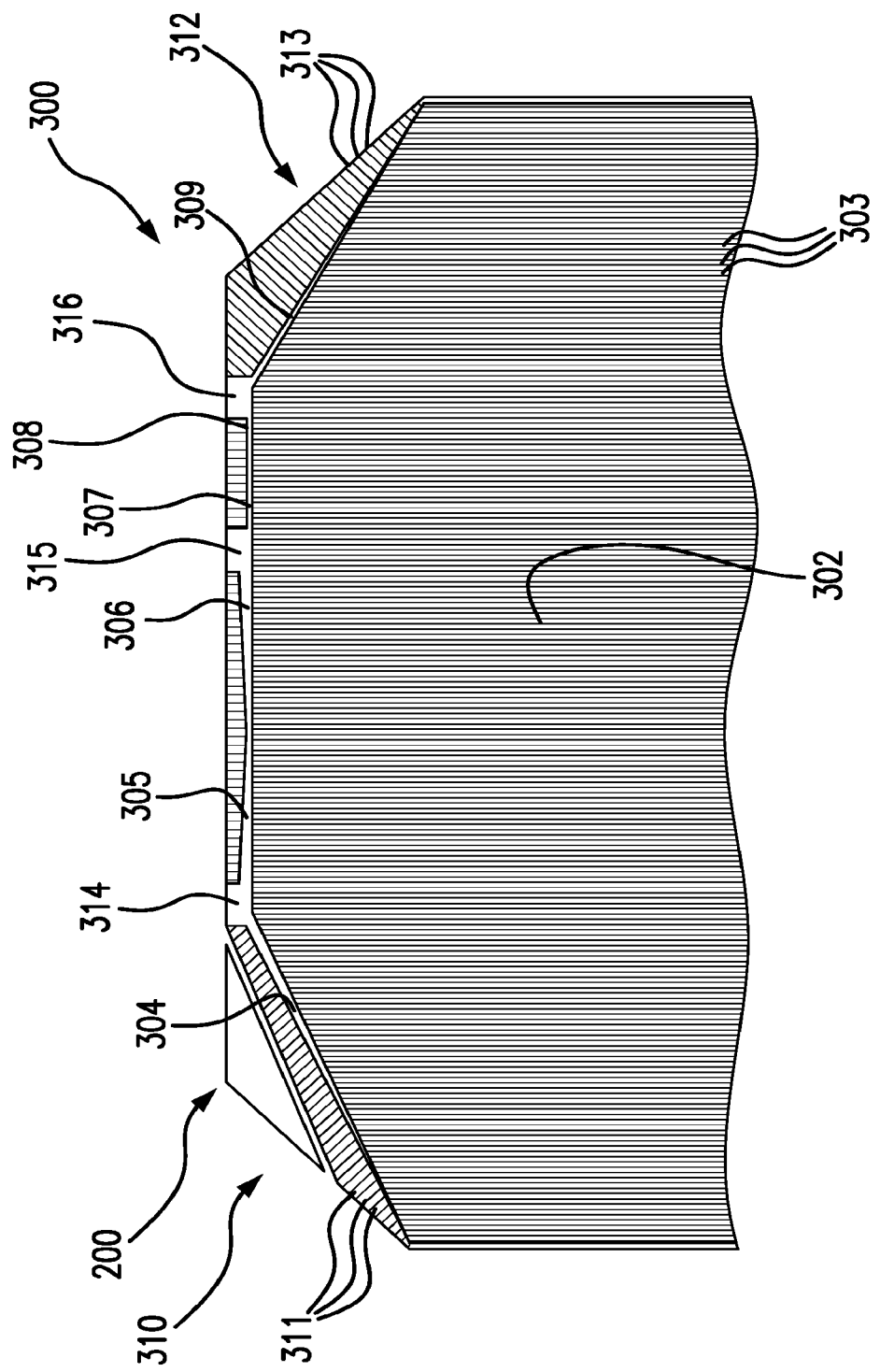
FIG. 4C is a top plan view of a portion of a solar cell with cropped corners together with a bypass diode disposed in one portion of a cropped corner of the solar cell.

FIG. 4C illustrates how the bypass diode 200 can be placed at one of the four corners of each of the solar cells. FIG. 8A will later illustrate the entire top surface of the solar cell, with four cropped corners with contact pads on the top surface and interconnect elements that can be used to interconnect the solar cell with other solar cells.

Figure 4D:
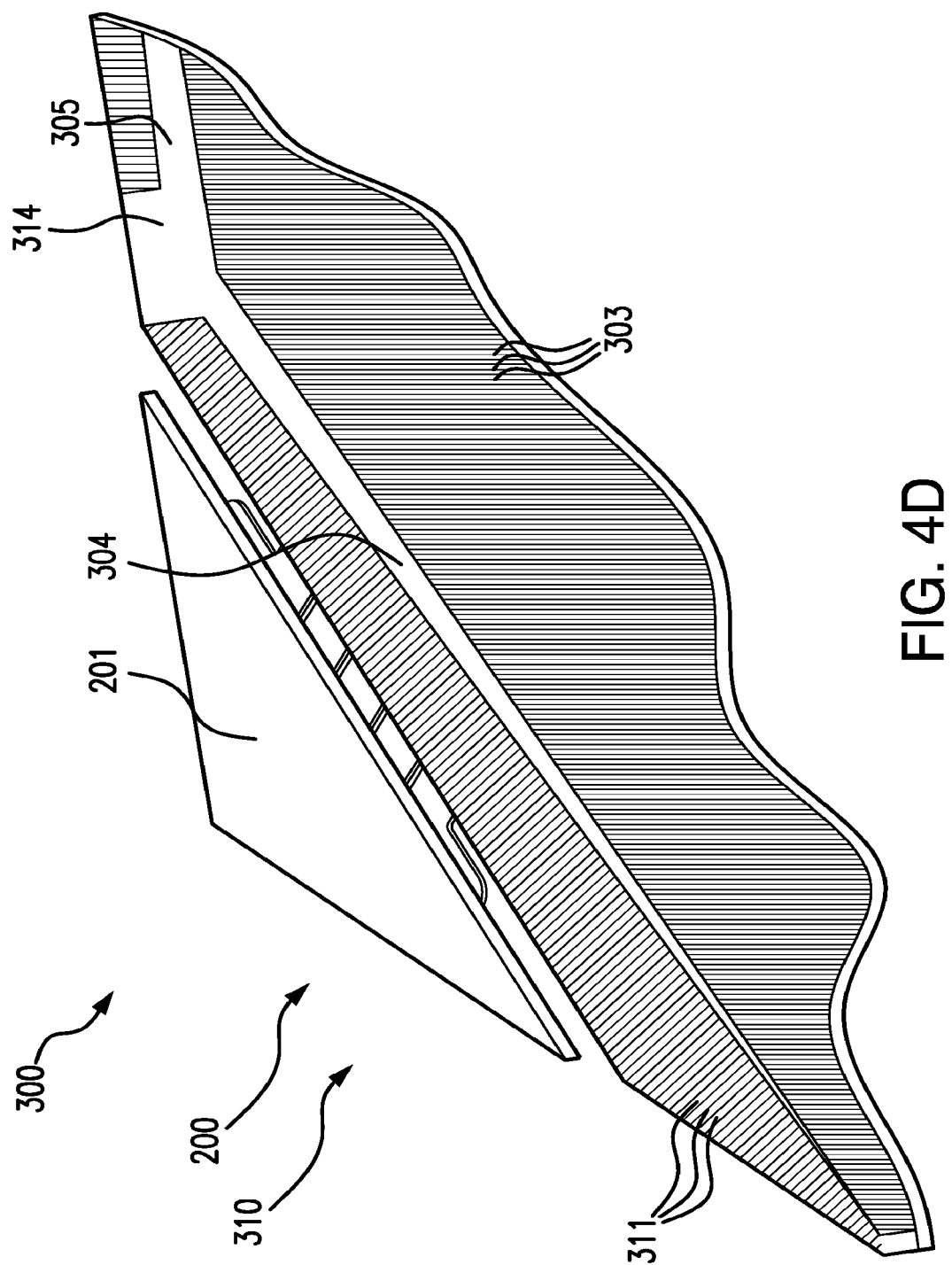
FIG. 4D is an enlarged top plan view of a portion of the solar cell of FIG. 4C in the region of the bypass diode.

FIG. 4D is an enlarged top plan view of a portion of solar cell 300 of FIG. 4C in the region of the bypass diode 200. FIG. 4D schematically illustrates the top perspective view of a solar cell 300 with cropped corners which is provided with a bypass diode 200 at one cropped corner 310. The bypass diode 200 has a substantially triangular shape, with acute angles about 22.5 degrees, making efficient use of the space at the cropped corners. The bypass diode is welded to the bottom surface of the solar cell 300 as illustrated in FIG. 3B.

The top surface or contact 201 of the bypass diode 200 can be connected to bus bar 304 by first connector 100, and the bottom surface or contact of the bypass diode 200 is connected to the bottom metal layer 340 by a second connector 100. Due to its placement at a cropped corner and due to its connection to the solar cell 300 through the interconnector element 100, it has been found practical to use a bypass diode having a polygonal shape, such as the triangular shape of the bypass diode 200 of FIG. 2A.

Figure 4E:
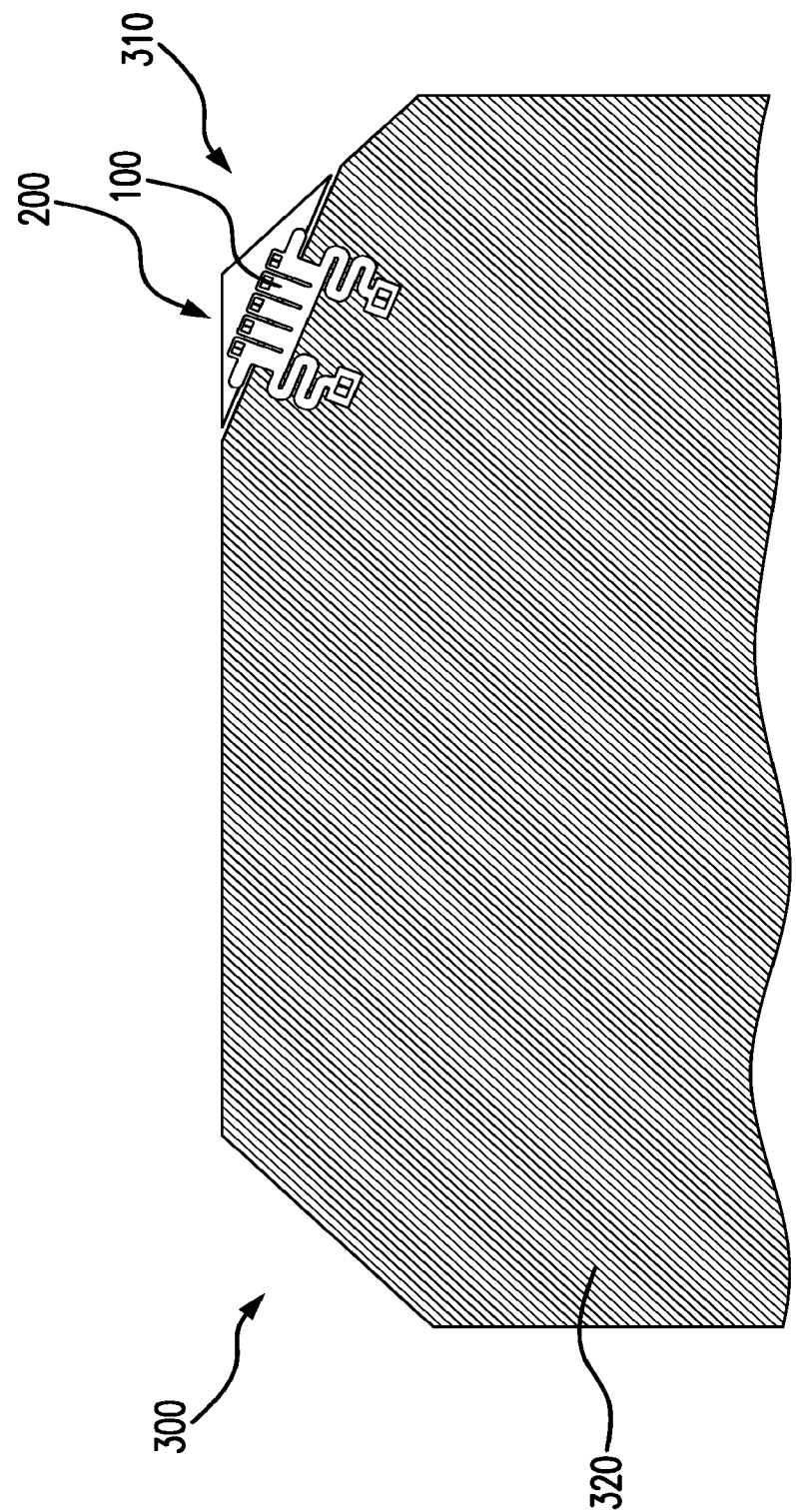
FIG. 4E is a bottom plan view of a portion of a solar cell with cropped corners together with a bypass diode disposed in one portion of a cropped corner of the solar cell with the interconnect element of FIG. 1 mounted and welded to both the bypass diode and the solar cell.

FIG. 4E is a bottom plan view of a portion of solar cell 300 with cropped corners together with bypass diode 200 disposed in one portion of cropped corner 310 of solar cell 300 with the interconnect element 100 of FIG. 1 mounted and welded to both bypass diode 200 and the lower or bottom side 320 of solar cell 300.

Figure 5A:
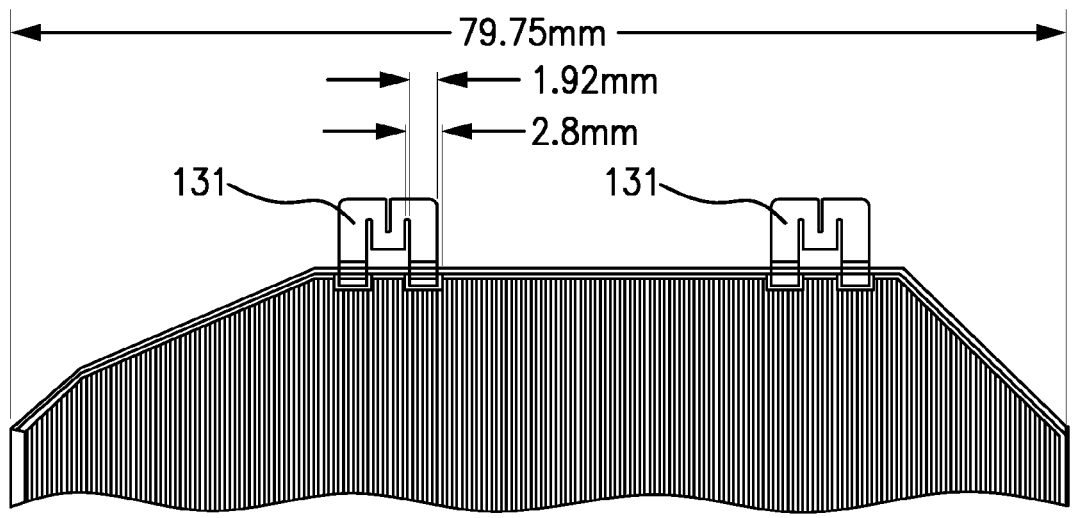
FIG. 5A is a top plan view of a portion of a solar cell with cropped corners with a bypass diode and interconnect elements, as known in the art.
Figure 5B:
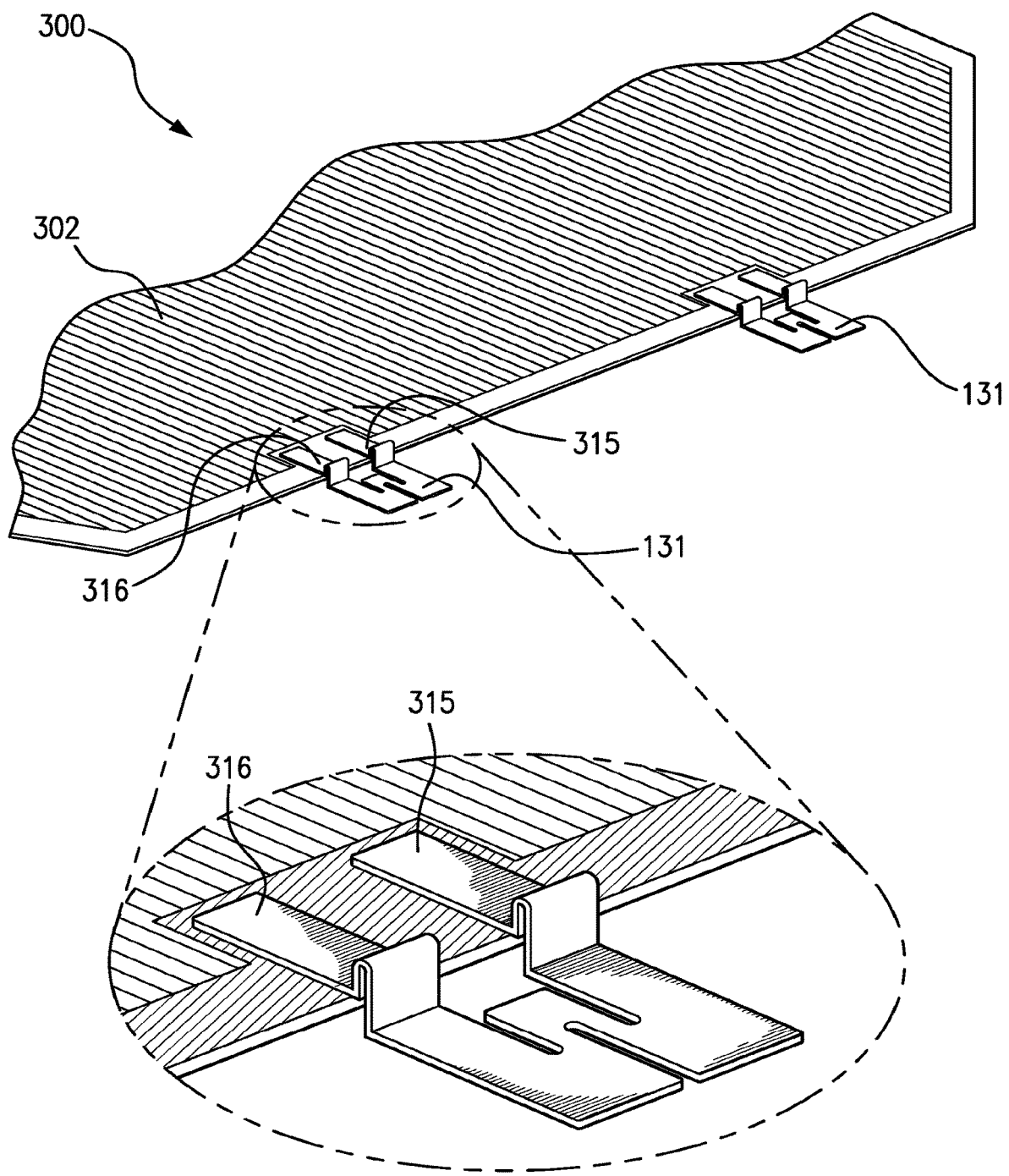
FIG. 5B is a perspective view of a portion of a solar cell with cropped corners of FIG. 5A more specifically depicting the interconnect elements as known in the art.

The interconnect elements illustrated in FIG. 5A and FIG. 5B are sometimes referred to as a "Z Interconnect". The interconnect 131 can include, for example, first and second flat contact members 315, 316 that extend outward for contact, respectively, with two different portions of the pad or terminal on the upper or top side 302 of a solar cell 300. An advantage of providing two separate contact members to two different portions of the terminal is that thereby one can achieve improved reliability in the event one of the electrical contacts is broken. The interconnect is serpentine shaped, with middle portions for electrical contact with the bus bar. The interconnect can include one or more gaps where the planar surface changes direction, for stress relief.

Figure 5C:
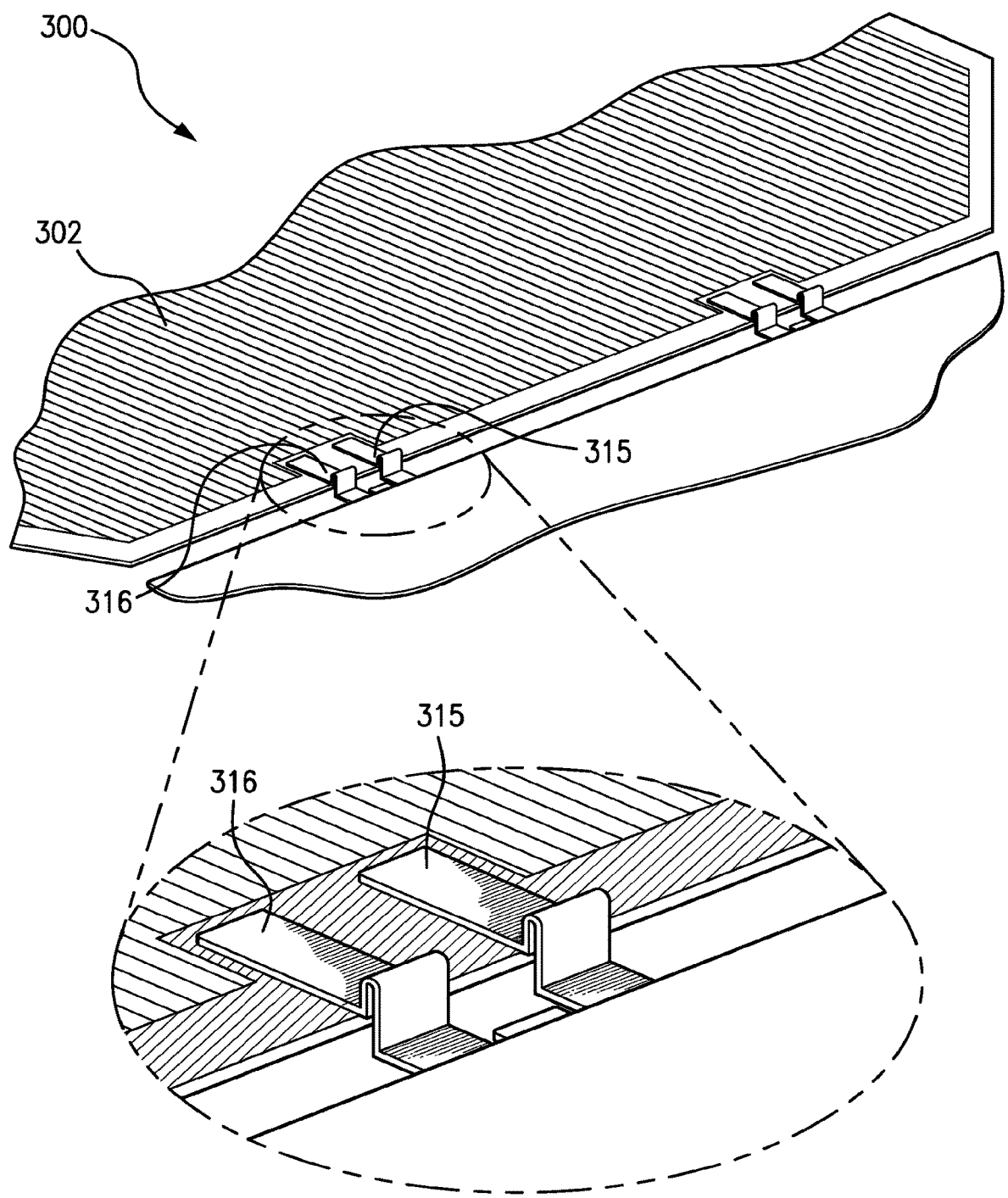
FIG. 5C is a perspective view of a portion of a solar cell of FIG. 5B with the interconnect elements connected to the back side of an adjoining solar cell.

FIG. 5C is a perspective view of a portion of a solar cell of FIG. 5B with the interconnect elements connected to the back side of an adjoining solar cell.

Figure 5D:
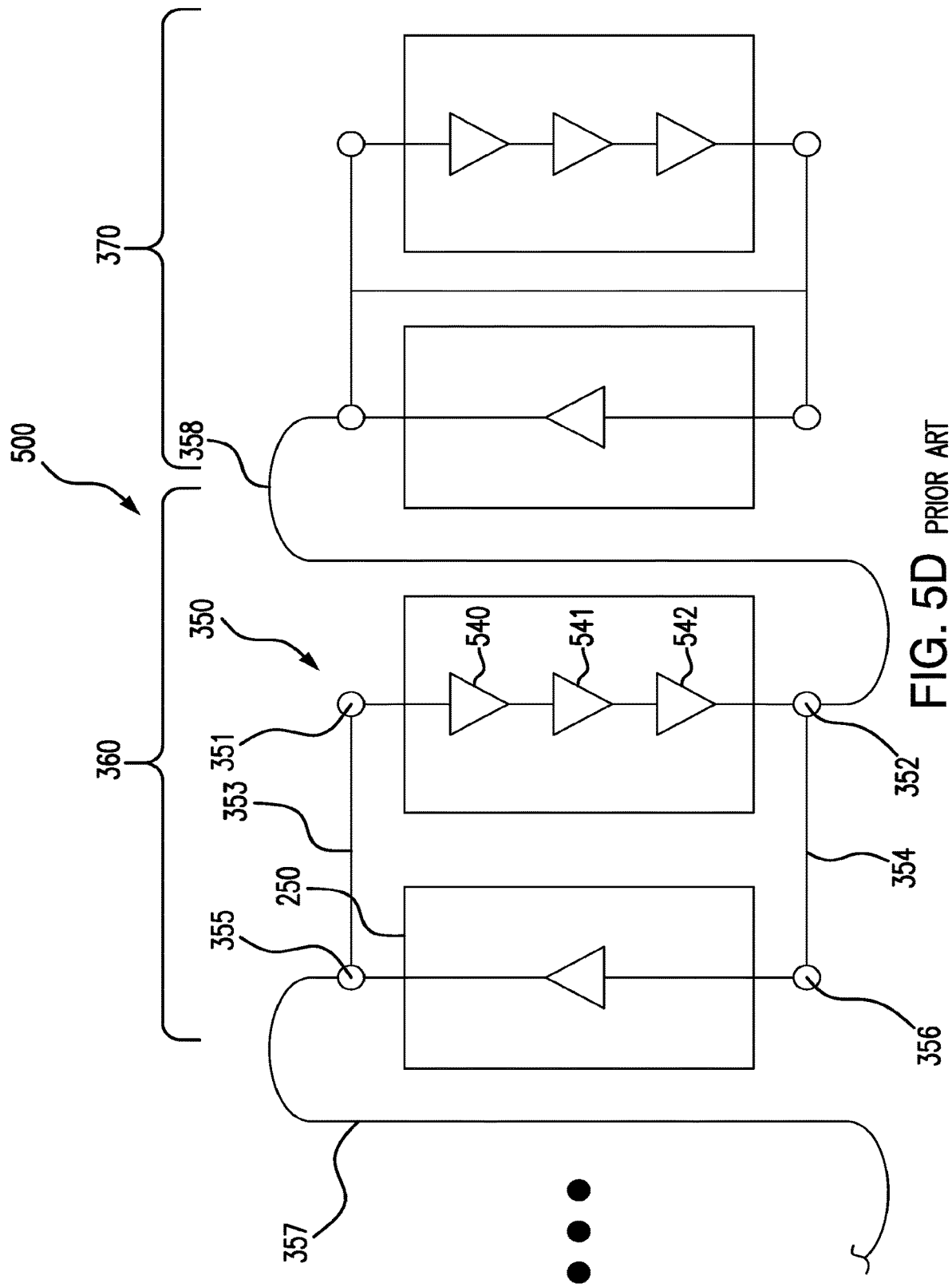
FIG. 5D is a schematic diagram of a three junction solar cell connected to a bypass diode.

FIG. 5D schematically illustrates the electrical circuit diagram of solar cell array 500, which includes a triple junction solar cell 360 having a multijunction stack 350 comprising subcells 540, 541, and 542. The multijunction stack 350 is provided with electrical terminals and/or contact pads 351 and 352 for connection via external metal connectors 353 and 354 respectively, to terminals 355 and 356 respectively, of a discrete bypass diode 250. The right hand portion of FIG. 5D schematically illustrates how such a triple junction solar cell 360 can be connected in series with another solar cell 370 (e.g., a CIC), which can be connected in series with further solar cells, using interconnects 357 and 358.

Figure 6:
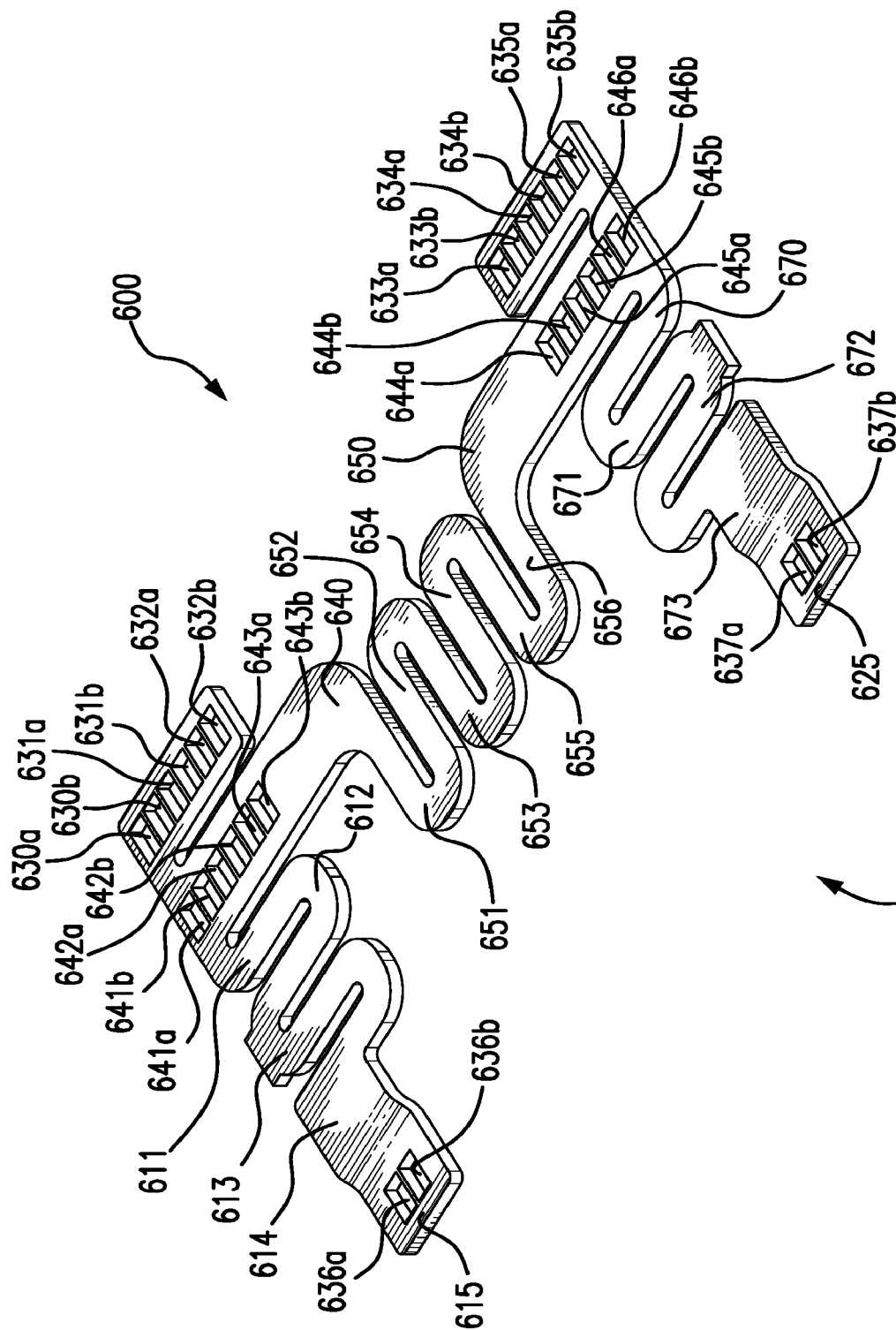
FIG. 6 is a perspective view of a second interconnect element for a solar cell according to the present disclosure in a first embodiment.

FIG. 6 is a perspective view of a second interconnect element 600 for a solar cell according to the present disclosure in a second embodiment. Second interconnect element 600 includes a first end including members 640 and 650 for mounting to an adjoining first component and a second opposing end 610 including members 615 and 625 for mounting to an adjoining second component.

In the embodiment illustrated in FIG. 6, members 640 and 650 of the first end include each include duplicate sets of three pairs of parallel apertures. Specifically, member 640 includes a first set of parallel apertures 630a/630b, 631a/631b, and 632a/632b and a second set of three pairs of parallel apertures 641a/641b, 642a/642b, and 643a/643b. Similarly, member 650 includes a first set of parallel apertures 633a/633b, 634a/634b, and 635a/635b and a second set of three pairs of parallel apertures 644a/644b, 645a/646b, and 646a/646b.

In the embodiment illustrated in FIG. 6, member 640 of the first end is attached to member 650 of the first end by member connecting portions 651, 652, 653, 654, 655, and 656. As illustrated in FIG. 6, member connecting portions 651, 652, 653, 654, 655, and 656 are depicted as curved portions which can provide, for example, some degree of flexibility in the final mounted structures. The first end also includes portions 611 and 670 on opposing portions of the first end for connecting to the second opposing and 610 of second interconnect element 600.

In the embodiment illustrated in FIG. 6, second opposing end 610 includes members 615 and 625. Member 615 includes portion 614 having the pair of parallel gap apertures 636a/636b, which is attached to portion 611 of first end by interconnect connecting portions 612 and 613 of member 615. Member 625 includes portion 673 having the pair of parallel gap apertures 637a/637b, which is attached to portion 670 of first end by interconnect connecting portions 671 and 672 of member 625. As illustrated in FIG. 6, interconnect connecting portions 612 and 613, and interconnect connecting portions 671 and 672 are depicted as curved portions which can provide, for example, some degree of flexibility in the final mounted structures.

Figure 7A:
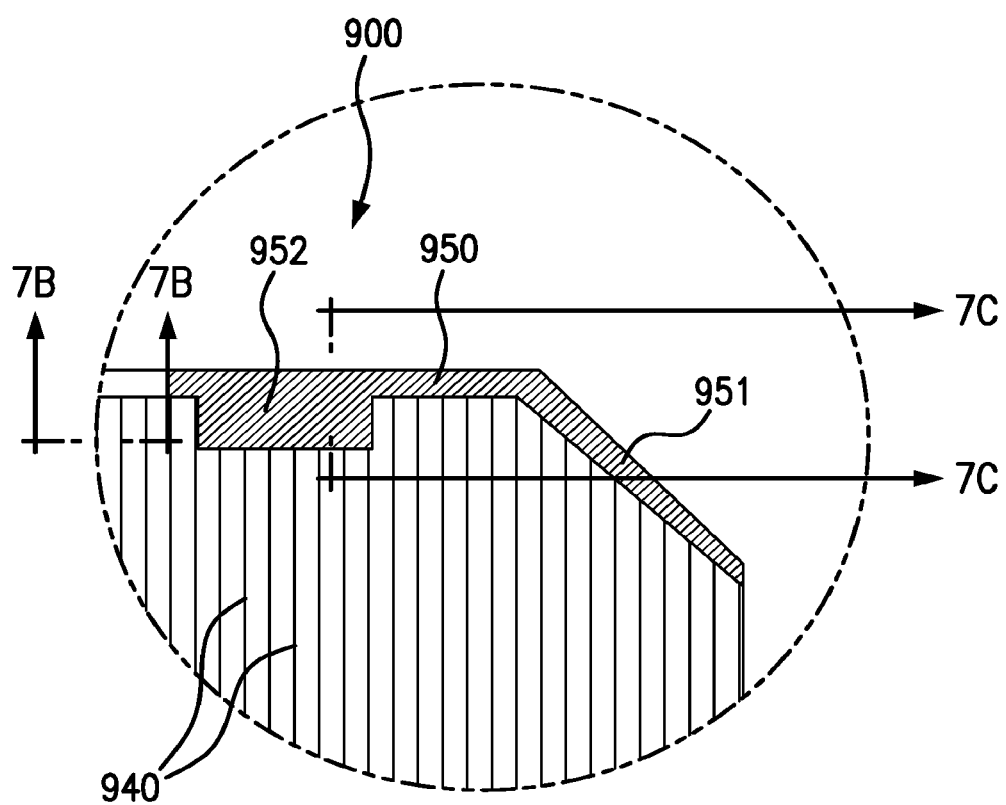
FIG. 7A is a top plan view of a portion of a solar cell according to the present disclosure.

FIG. 7A is a top plan view of a portion of a solar cell 900 according to the present disclosure depicting metal grid layers 940 and metal contact pad 952 adjacent peripheral edge regions 950 and 951 of solar cell 900.

Figure 7B:
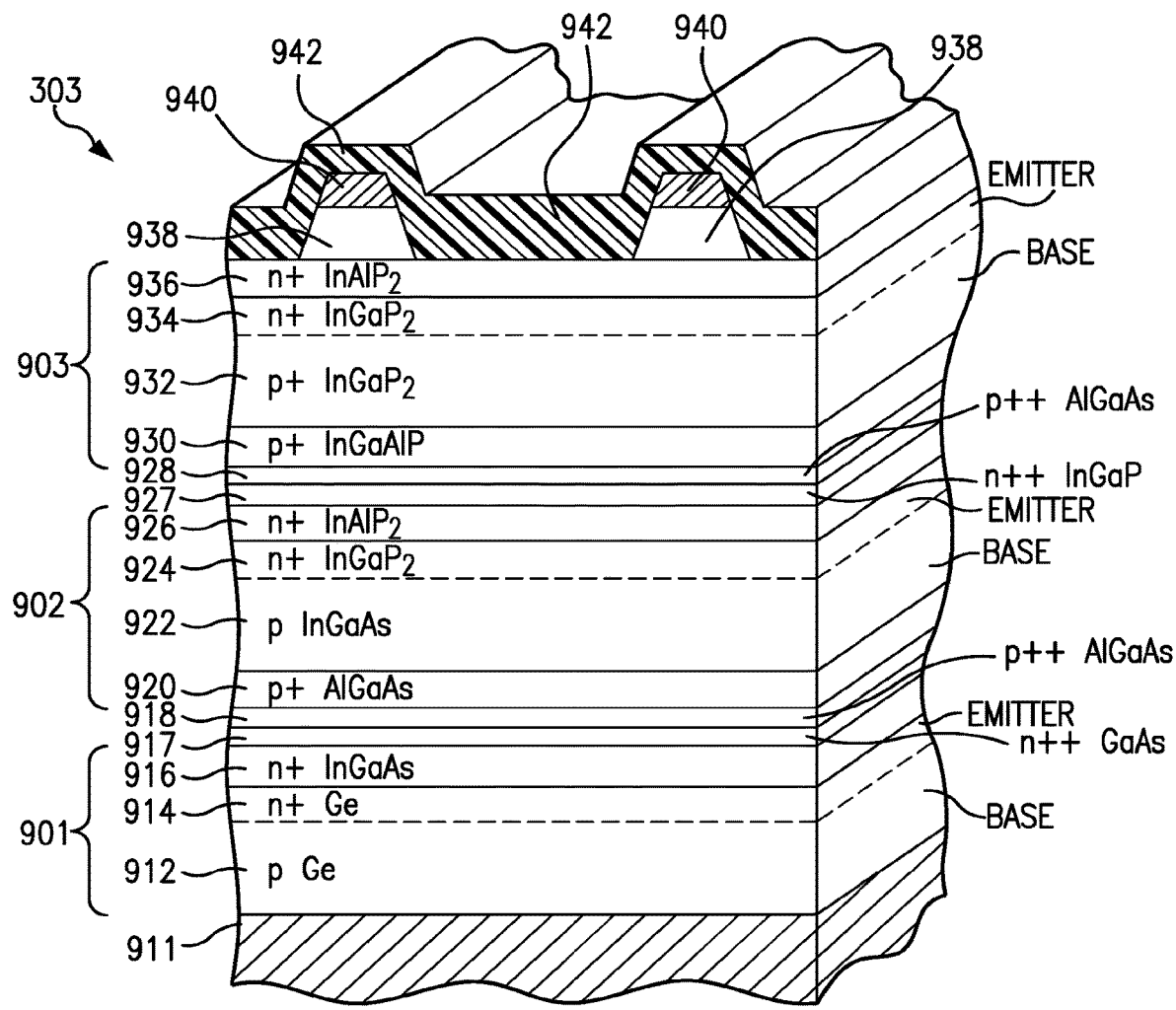
FIG. 7B is a cross-sectional view of a multijunction solar cell through the 7B-7B plane of the solar cell of FIG. 7A.

FIG. 7B illustrates a particular example of the cross-section of a typical multijunction solar cell device 900 which may be used to implement the solar cell array as provided by the present disclosure. In FIG. 7B, each dashed line indicates the active region junction between a base layer and emitter layer of a subcell.

As shown in the illustrated example of FIG. 7B, the bottom subcell 901 includes a substrate 912 formed of p-type germanium ("Ge") which also serves as a base layer. A contact pad 911 can be formed on the bottom of base layer 912 to provide electrical contact to the multijunction solar cell 303. The bottom subcell 901 further includes, for example, a highly doped n-type Ge emitter layer 914, and an n-type indium gallium arsenide ("InGaAs") nucleation layer 916. The nucleation layer is deposited over the base layer 912, and the emitter layer is formed in the substrate by diffusion of deposits into the Ge substrate, thereby forming the n-type Ge layer 914. Heavily doped p-type aluminum gallium arsenide ("AlGaAs") and heavily doped n-type gallium arsenide ("GaAs") tunneling junction layers 918, 917 may be deposited over the nucleation layer 916 to provide a low resistance pathway between the bottom and middle subcells.

In the illustrated example of FIG. 7B, the middle subcell 902 includes a highly doped p-type aluminum gallium arsenide ("AlGaAs") back surface field ("BSF") layer 920, a p-type InGaAs base layer 922, a highly doped n-type indium gallium phosphide ("InGaP2") emitter layer 924 and a highly doped n-type indium aluminum phosphide ("AlInP2") window layer 926. The InGaAs base layer 922 of the middle subcell 902 can include, for example, approximately 1.5% In. Other compositions may be used as well. The base layer 922 is formed over the BSF layer 920 after the BSF layer is deposited over the tunneling junction layers 918 of the bottom subcell 901.

The BSF layer 920 is provided to reduce the recombination loss in the middle subcell 902. The BSF layer 920 drives minority carriers from a highly doped region near the back surface to minimize the effect of recombination loss. Thus, the BSF layer 920 reduces recombination loss at the backside of the solar cell and thereby reduces recombination at the base layer/BSF layer interface. The window layer 926 is deposited on the emitter layer 924 of the middle subcell 902. The window layer 926 in the middle subcell 902 also helps reduce the recombination loss and improves passivation of the cell surface of the underlying junctions Before depositing the layers of the top cell 903, heavily doped n-type InGaP and p-type AlGaAs tunneling junction layers 927, 928 may be deposited over the middle subcell 902.

In the illustrated example, the top subcell 909 includes a highly doped p-type indium gallium aluminum phosphide ("InGaAlP") BSF layer 930, a p-type InGaP2 base layer 932, a highly doped n-type InGaP2 emitter layer 934 and a highly doped n-type InAlP2 window layer 936. The base layer 932 of the top subcell 903 is deposited over the BSF layer 930 after the BSF layer 930 is formed over the tunneling junction layers 928 of the middle subcell 902. The window layer 936 is deposited over the emitter layer 934 of the top subcell after the emitter layer 934 is formed over the base layer 932. A cap or contact layer 938 may be deposited and patterned into separate contact regions over the window layer 936 of the top subcell 903. The cap or contact layer 938 serves as an electrical contact from the top subcell 903 to metal grid layer 940. The doped cap or contact layer 938 can be a semiconductor layer such as, for example, a GaAs or InGaAs layer.

After the cap or contact layer 938 is deposited, the grid lines 940 are formed. The grid lines 940 are deposited via evaporation and lithographically patterned and deposited over the cap or contact layer 938. The mask is subsequently lifted off to form the finished metal grid lines 940 as depicted in FIG. 7B, and the portion of the cap layer that has not been metallized is removed, exposing the surface of the window layer 936.

Figure 7C:
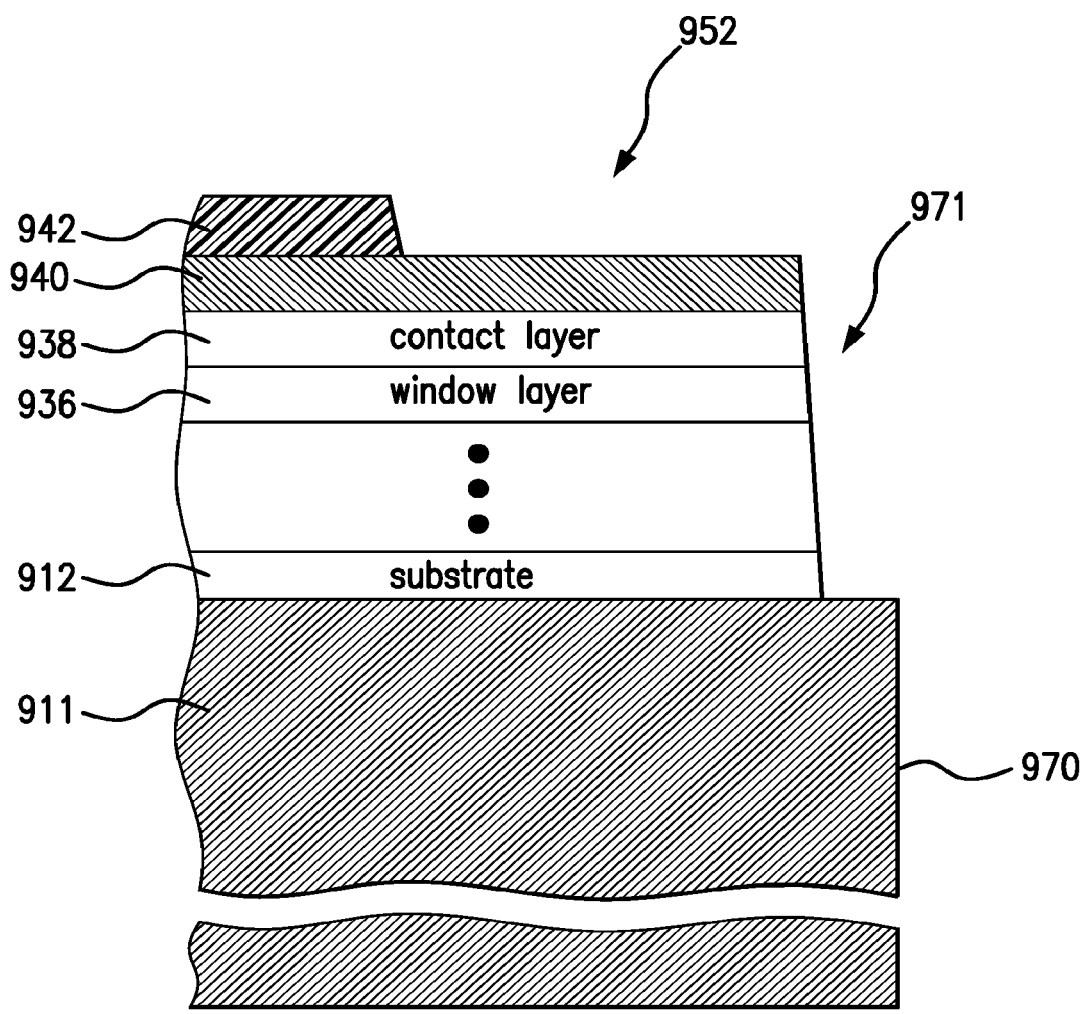
FIG. 7C is a cross-sectional view of the solar cell of FIG. 7A through the 7C-7C plane shown in FIG. 7A.

In some embodiments, a trench or channel 971 shown in FIG. 7C, or portion of the semiconductor structure, is also etched around each of the solar cells. These channels 971 define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer.

As more fully described in U.S. Patent Application Publication No. 2010/0012175 A1 (Varghese et al.), hereby incorporated by reference in its entirety, the grid lines 940 are preferably composed of Ti/Au/Ag/Au, although other suitable materials may be used as well.

During the formation of the metal contact layer 940 deposited over the p+ semiconductor contact layer 938, and during subsequent processing steps, the semiconductor body and its associated metal layers and bonded structures will go through various heating and cooling processes, which may put stress on the surface of the semiconductor body. Accordingly, it is desirable to closely match the coefficient of thermal expansion of the associated layers or structures to that of the semiconductor body, while still maintaining appropriate electrical conductivity and structural properties of the layers or structures. Thus, in some embodiments, the metal contact layer 940 is selected to have a coefficient of thermal expansion (CTE) substantially similar to that of the adjacent semiconductor material. In relative terms, the CTE may be within a range of 0 to 15 ppm per degree Kelvin different from that of the adjacent semiconductor material. In the case of the specific semiconductor materials described above, in absolute terms, a suitable coefficient of thermal expansion of layer 940 would range from 5 to 7 ppm per degree Kelvin. A variety of metallic compositions and multilayer structures including the element molybdenum would satisfy such criteria. In some embodiments, the layer 940 would preferably include the sequence of metal layers Ti/Au/Mo/Ag/Au, Ti/Au/Mo/Ag, or Ti/Mo/Ag, where the thickness ratios of each layer in the sequence are adjusted to minimize the CTE mismatch to GaAs. Other suitable sequences and material compositions may be used in lieu of those disclosed above.

In some embodiments, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

The grid lines are used as a mask to etch down the surface to the window layer 936 using a citric acid/peroxide etching mixture.

An antireflective (ARC) dielectric coating layer 942 is applied over the entire surface of the "top" side of the wafer with the grid lines 940.

FIG. 7C is a cross-sectional view of the solar cell of FIG. 7A through the 7C-7C plane shown in FIG. 7A. Specifically, FIG. 7C is a highly simplified cross-sectional view of the solar cell of FIG. 7A similar to that of FIG. 7B, but in a view longitudinally along a grid line. A contact pad 952 electrically connected to the grid line metal 940 is depicted.

Figure 7D:
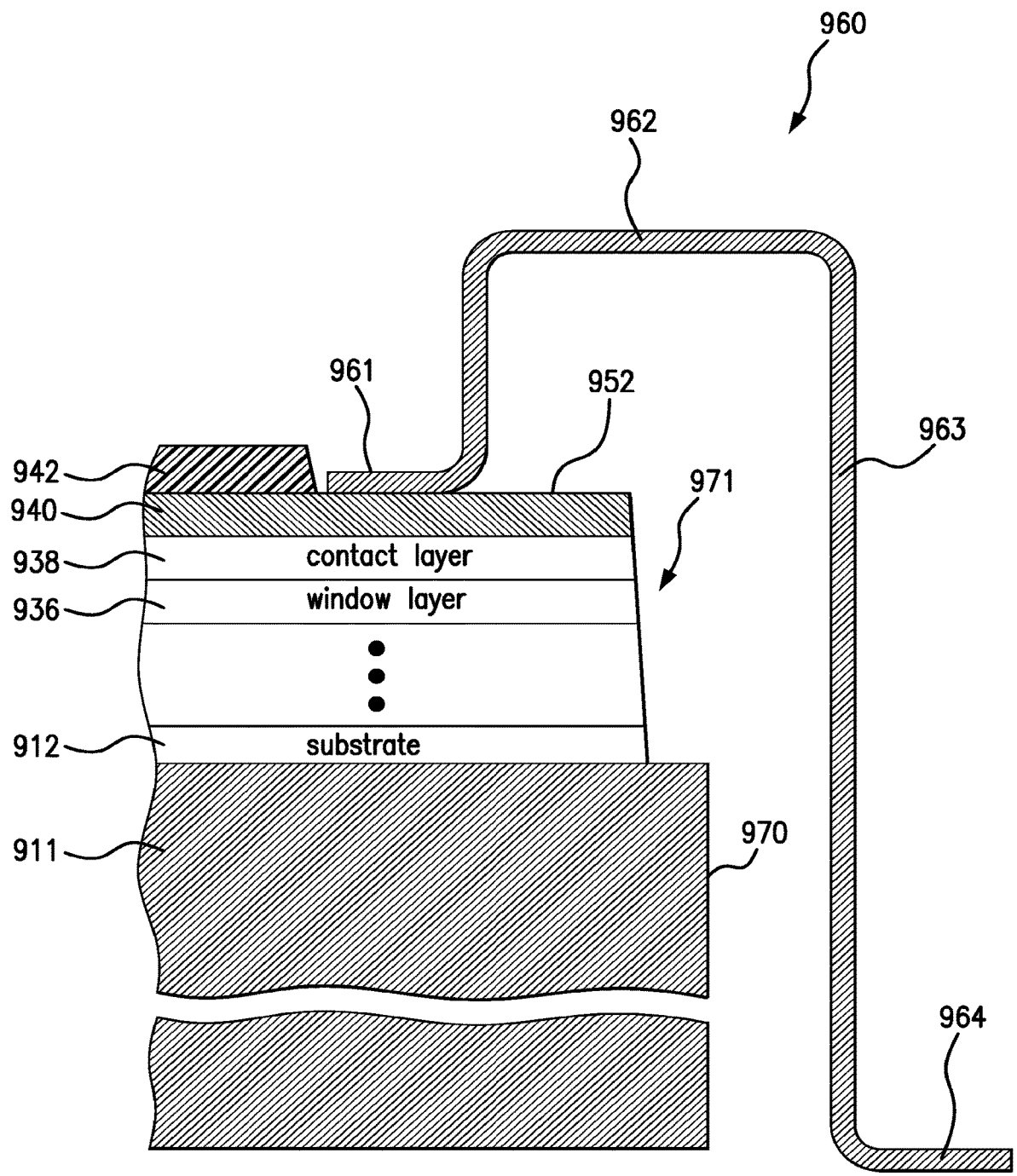
FIG. 7D is a cross-sectional view of the solar cell of FIG. 7A through the 7C-7C plane shown in FIG. 7A after connection of an interconnect element.

FIG. 7D is a cross-sectional view of the solar cell of FIG. 7A through the 7C-7C plane shown in FIG. 7A after connection of an interconnect element. FIG. 7D depicts the attachment of an interconnection member 960 to the metal contact pad 952. The interconnection member 960 is a planar rectangular clip having a first flat end-portion 961 welded to the metal contact 952, a second portion 962 connected to the first end-portion 961 and extending above the surface of the solar cell, and a third portion 963 connected to the second portion 962 and being serpentine in shape, and flat second end-portion 964 extending below the bottom of the solar cell and designed and oriented so that its flat upper side surface may be welded to the bottom metal contact 911 of an adjacent solar cell 600 as shown in FIG. 7F.

Figure 7E:
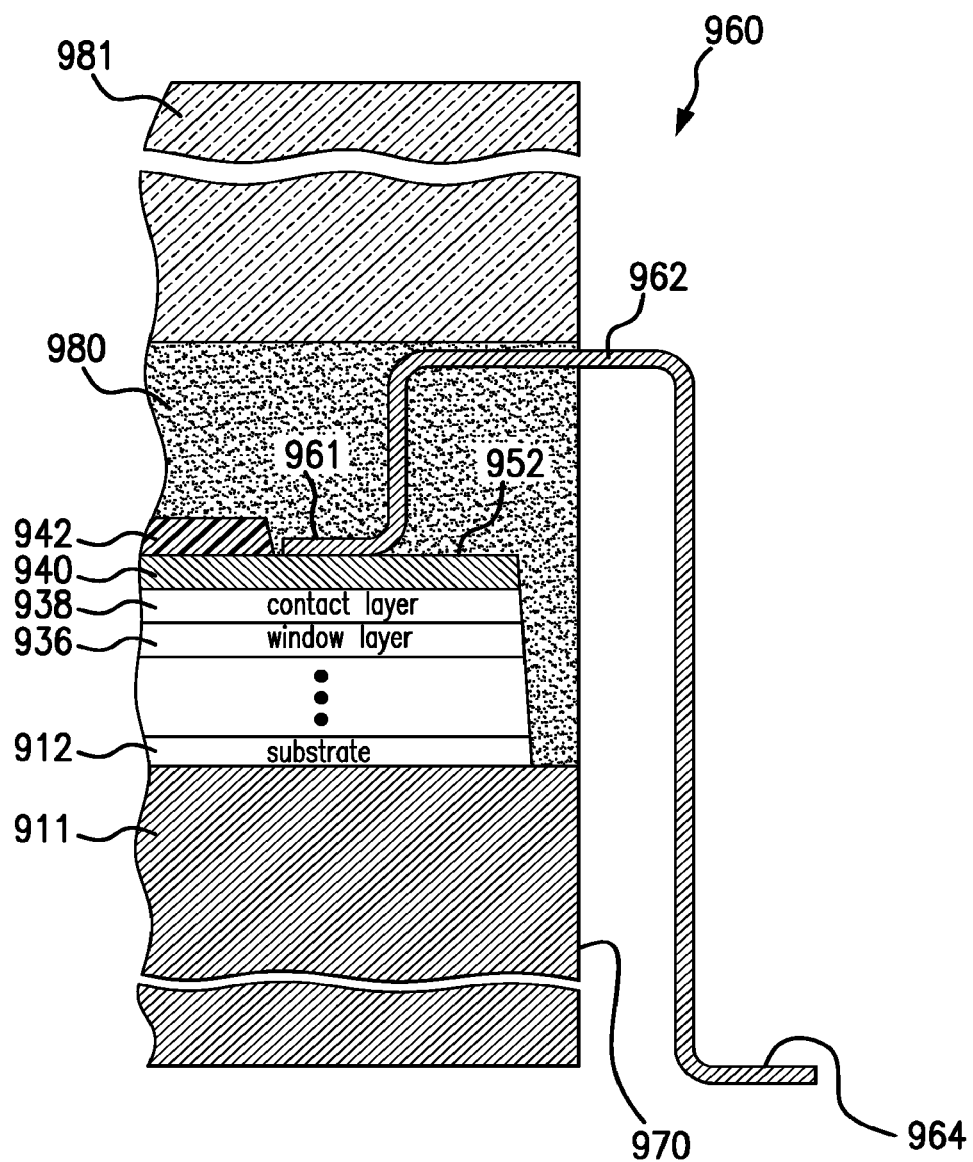
FIG. 7E is a cross-sectional view of the solar cell of FIG. 7A through the 7C-7C plane shown in FIG. 7A after attachment of a cover glass thereby forming a CIC.

FIG. 7E is a cross-sectional view of the solar cell of FIG. 7D after the next process step of attachment of a cover glass 981 to the top of the solar cell by an adhesive 980. The cover glass 981 is typically about 4 mils thick. Although the use of a cover glass is desirable for many environmental conditions and applications, it is not necessary for all implementations, and additional layers or structures may also be utilized for providing additional support or environmental protection to the solar cell.

Figure 7F:
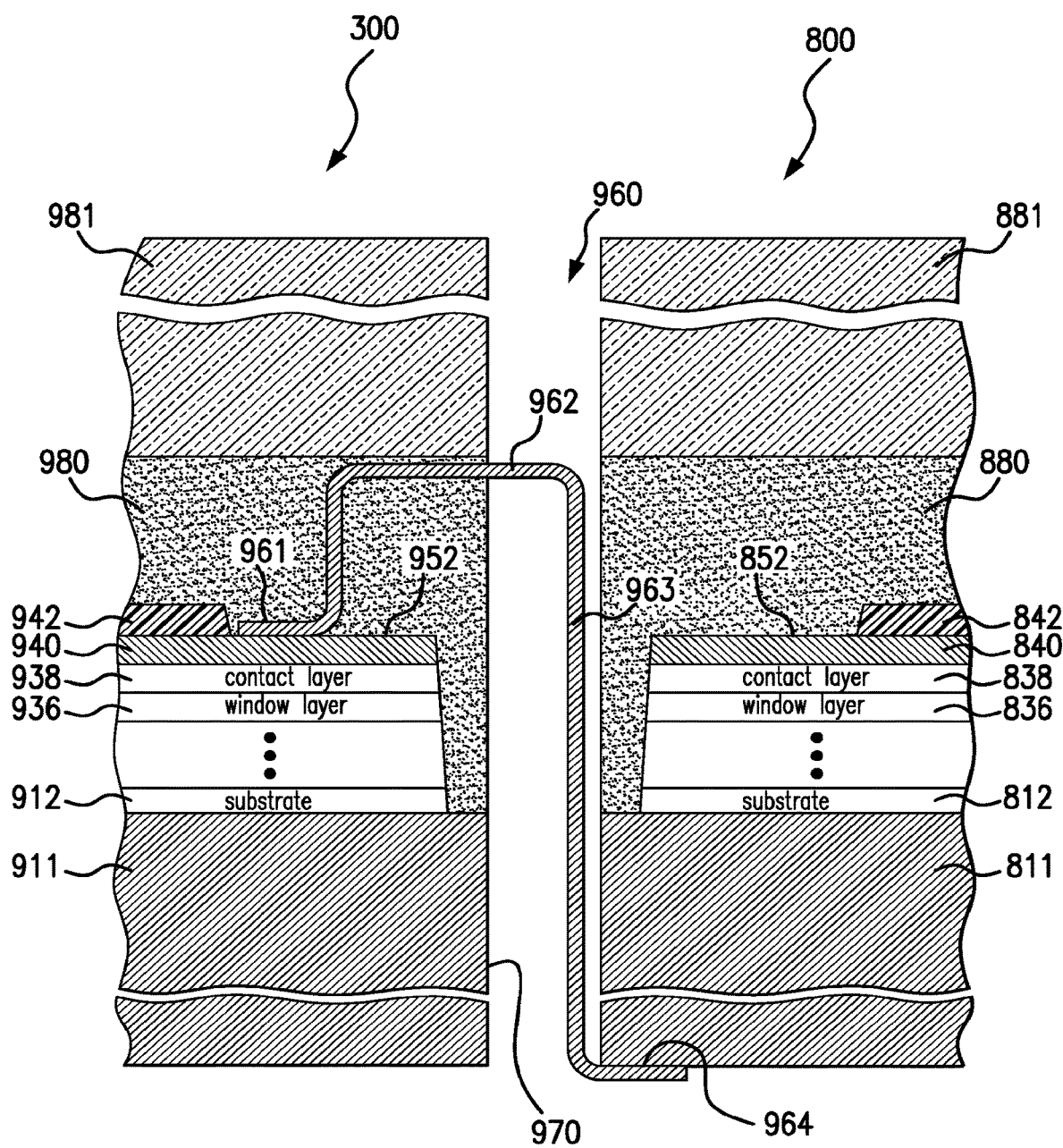
FIG. 7F is a cross-sectional view of the CIC of FIG. 7E after electrical connection to a solar cell on an adjacent CIC.

FIG. 7F is a cross-sectional view of the solar cell of FIG. 7E, which is now designated as cell 300, after the next process step of alignment with the edge of an adjacent similar solar cell 800, in the process of fabricating an interconnected array or string of solar cells. The similar solar cell 800 includes layers 811, 812 through 836, 838, and 840 similar to layers 911, 912, ... through 936, 938, and 940 respectively of solar cell 300. A cover glass 881 is attached by adhesive 880 to the solar cell 800 similar to that in solar cell 300.

FIG. 8A is a top plan view of a portion of an array of solar cells that have been interconnected using the interconnect elements according to the present disclosure comprising a first string of series connected solar cells 300 and 400 each provided with a bypass diode 200. The bypass diode 200 is placed in correspondence with a cropped corner of the respective solar cell, thus making use of the space that is left free between adjacent solar cells due to the cropped corners, as shown in FIG. 4A. Solar cells 300 and 400 are connected in series. The N End of the portion of the string of solar cells includes interconnect elements 600 that can be used to connect additional solar cells to the solar cell array. Each string can comprise a large number of solar cells, and the solar cell assembly or array can comprise a large number of strings.

FIG. 8B is an enlarged top plan view of the left hand portion of solar cell 400 with cropped corners in the array shown in FIG. 8A which is provided with a bypass diode 200 having a top surface 201 at one cropped corner 310. The bypass diode 200 has a substantially triangular shape, with acute angles about 22.5 degrees, making efficient use of the space at the cropped corners. Grid lines 303 are present at the upper side to collect the generated current, and are connected to a bus bar 304 and 305, which includes contact pad 314 disposed on the top surface at an edge of solar cell 400. Wider spaced grid lines 311 couple to bus bar 304. The bypass diode is welded to the bottom surface of solar cell 400, with FIG. 8B showing a portion of interconnect element 100 attaching bypass diode 200 to the solar cell, which is further illustrated in the bottom plan view of FIG. 8E.

FIG. 8C is an enlarged top plan view of the left hand portion of solar cell 400 of FIG. 8B after placement of the second opposing end 610 of interconnect element 600 of FIG. 6 on the top surface 201 of bypass diode 200, and on contact pad 314 of solar cell 400 of FIG. 8B. Specifically, for the second opposing end of interconnect element 600, member 625 including portion 673 having the pair of parallel gap apertures 637a/637b is placed on the top surface 201 of bypass diode 200, and member 615 including portion 614 having the pair of parallel gap apertures 636a/636b is placed on contact pad 314 of solar cell 400.

The pair of parallel gap apertures 637a/637b of member 625 can provide one welding point for mounting the second opposing end 610 of interconnect element 600 to the top surface 201 of bypass diode 200, and the pair of parallel gap apertures 636a/636b of member 615 can provide one welding point for mounting the second opposing end 610 of interconnect element 600 to the contact pad 314 of solar cell 400. A parallel gap welding tool 150 can be applied to pairs of parallel gap apertures in a manner similar to that illustrated in FIG. 2B to weld the opposing second end of interconnect element 600 to the aligned adjoining bypass diode 200 and solar cell 400.

Figure 8D:
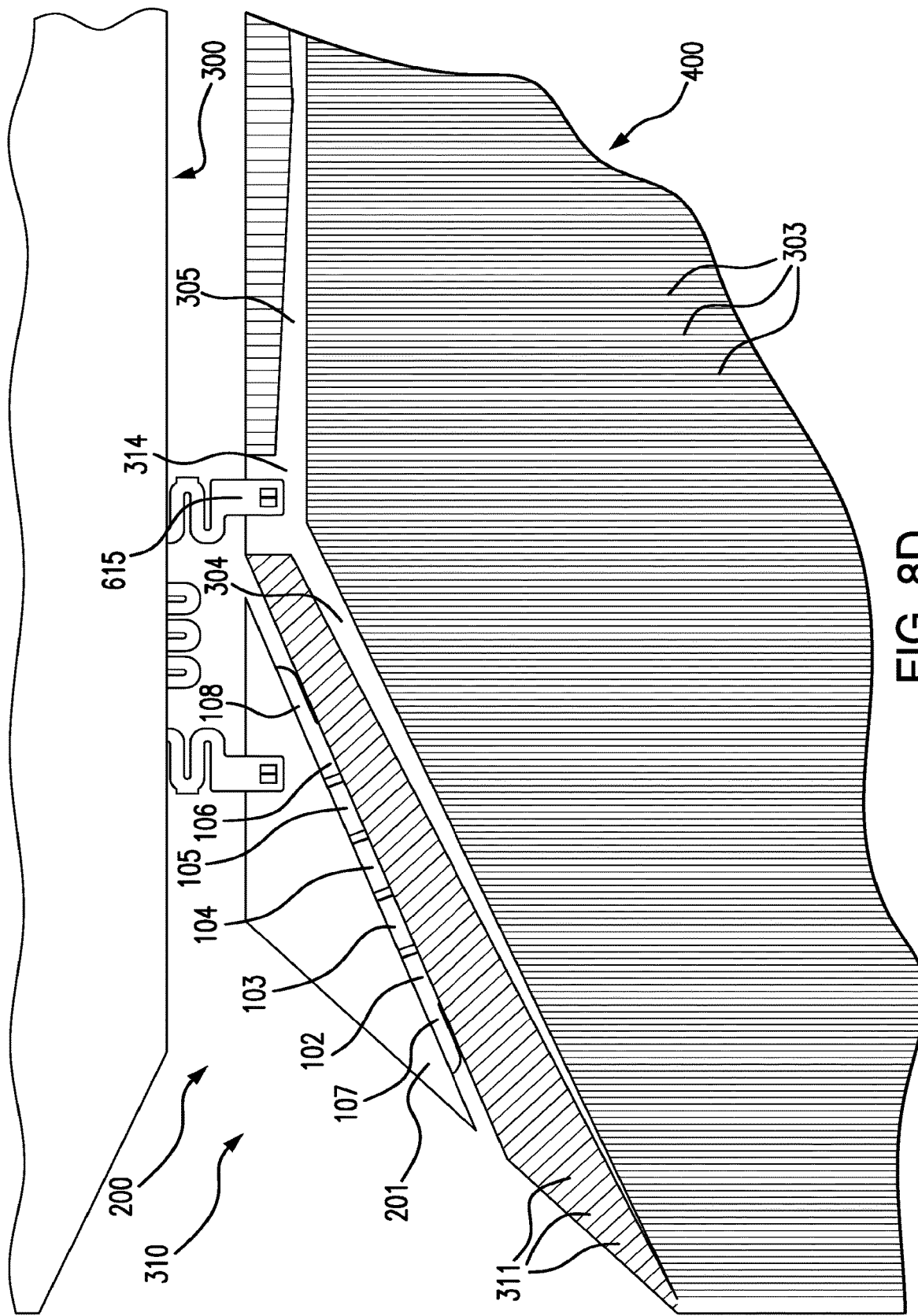
FIG. 8D is an enlarged top plan view of the left hand portion of the solar cell of FIG. 8C after connection of the solar cell to an adjacent solar cell using the interconnect element of FIG. 6.

FIG. 8D is an enlarged top plan view of the left hand portion of solar cell 400 of FIG. 8C after connection of solar cell 400 to adjacent solar cell 300 using the interconnect element 600 of FIG. 6. The bottom surface of solar cell 300 has been placed on the first end including members 640 and 650 of interconnect element 600 as further illustrated in the bottom plan view of FIG. 8E.

Figure 8E:
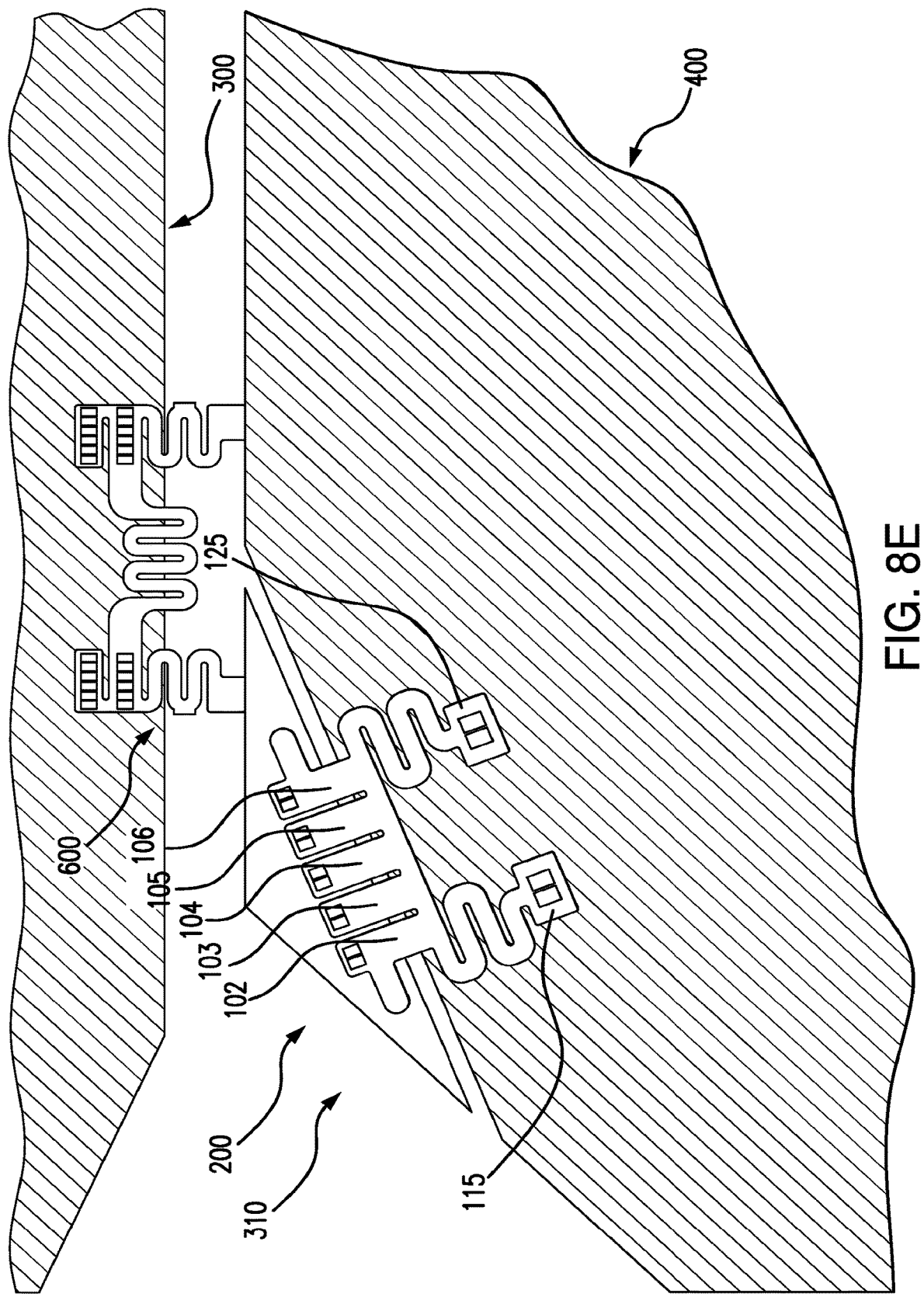
FIG. 8E is an enlarged bottom plan view of a portion of a solar cell shown in FIG. 8C showing the interconnect element of FIG. 1 mounted to the bypass diode and the interconnect element of FIG. 6 mounted to the top of the solar cell positioned for being connected by welding to an adjacent solar cell.
Figure 8F:
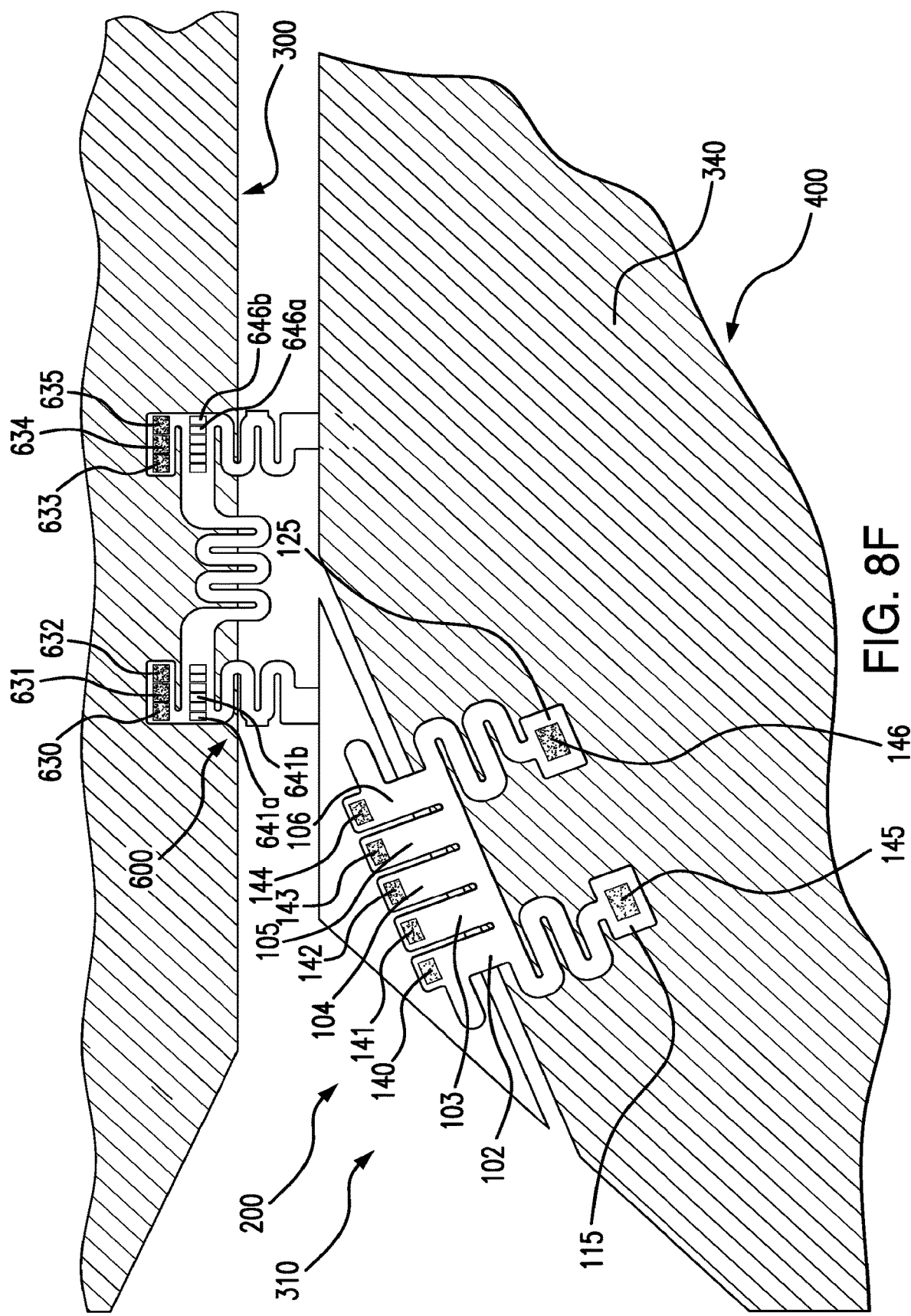
FIG. 8F is an enlarged bottom plan view of a portion of a solar cell shown in FIG. 8E showing the interconnect element of FIG. 6 after being connected by welding to the adjacent solar cell.

FIG. 8E is an enlarged bottom plan view of a portion of a solar cell shown in FIG. 8D showing interconnect element 100 of FIG. 1 having first end 101 mounted to the bottom surface of bypass diode 200, and the second opposing end including member 110 with portion 115 having the pair of parallel gap apertures 136a/136b, and member 120 with portion 125 having the pair of parallel gap apertures 137a/137b mounted to the bottom surface of solar cell 400. As illustrated in FIG. 8F, interconnect element 100 can be welded to the bottom surface of bypass diode 200 at five weld points 140, 141, 142, 143, and 144 as described in FIG. 2D. As also illustrated in FIG. 8F, interconnect element 100 can also be welded to the bottom surface of solar cell 400 at two weld points 145 and 146 as described in FIG. 3B.

FIG. 8E also shows the interconnect element 600 of FIG. 6 having the second opposing end 610 mounted to the top surface 201 of bypass diode 200 and the top surface of solar cell 400 as illustrated in FIG. 8C. FIG. 8E also illustrates the first end of interconnect element 600 including members 640 and 650 for mounting to the bottom surface of solar cell 300.

FIG. 8E also shows the interconnect element 600 of FIG. 6 having the first end including members 640 and 650 aligned for mounting to the adjacent solar cell 300.

FIG. 8F is an enlarged bottom plan view of a portion of a solar cell shown in FIG. 8E showing interconnect element 600 of FIG. 6 after being connected by welding to the adjacent solar cell 300. In the embodiment illustrated in FIG. 8F, member 640 has been welded at weld points 630, 631, and 632 using first set of parallel apertures 630a/630b, 631a/631b, and 632a/632b, and member 650 has been welded at weld points 633, 634, and 635 using first set of parallel apertures 633a/633b, 634a/634b, and 635a/635b. In the embodiment illustrated in FIG. 8F, second set of three pairs of parallel apertures 641a/641b, 642a/642b, and 643a/643b of member 640, and second set of three pairs of parallel apertures 644a/644b, 645a/646b, and 646a/646b of member 650 have not been used as weld points.

Figure 8G:
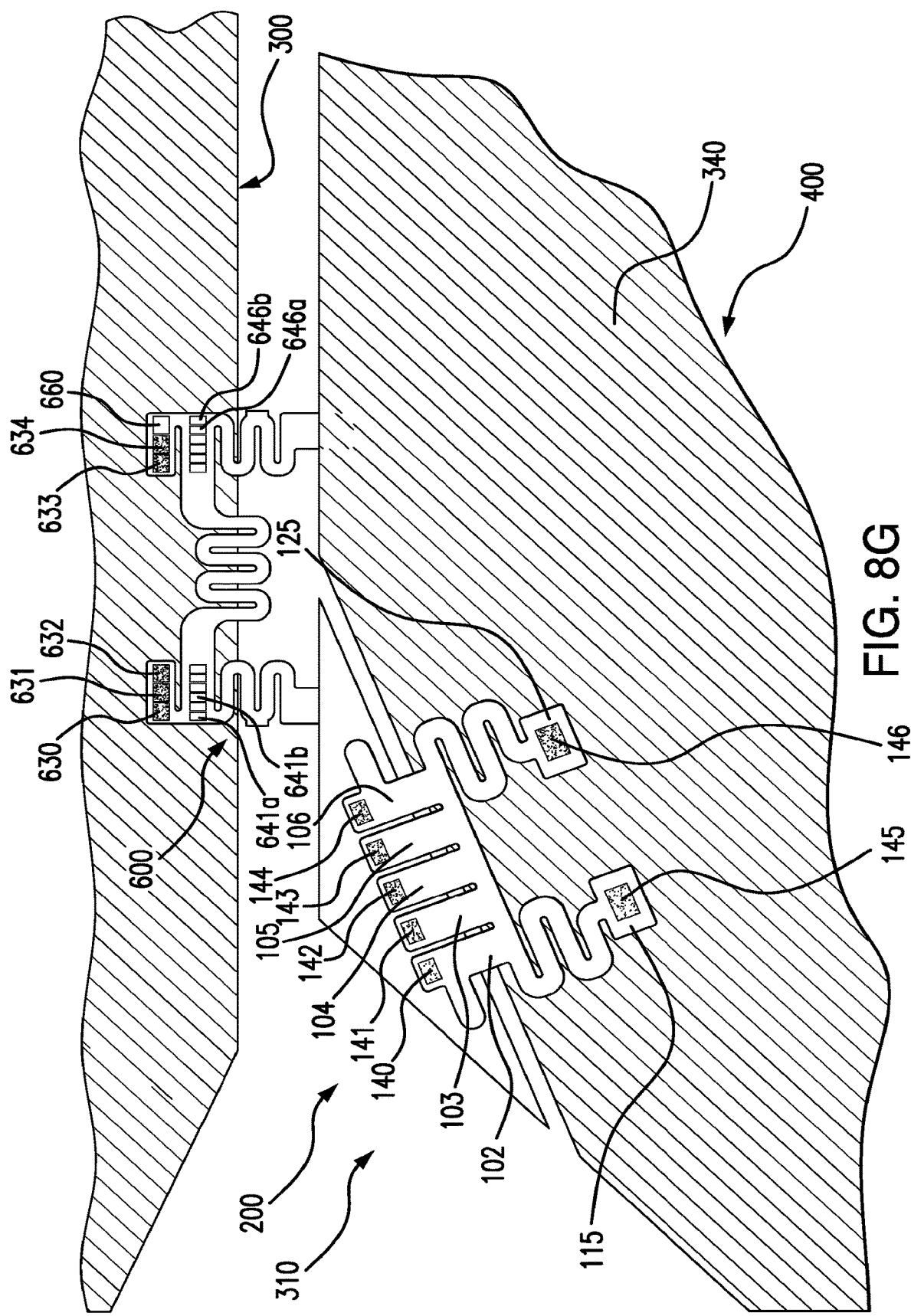
FIG. 8G is an enlarged bottom plan view of a portion of a solar cell shown in FIG. 8F showing the interconnect element of FIG. 6 after environmental testing and failure of one or more weld joints.

FIG. 8G is an enlarged bottom plan view of a portion of a solar cell shown in FIG. 8F showing interconnect element 600 of FIG. 6 after environmental testing and failure of one or more weld joints. Specifically, the failure of weld joint 635 is shown in FIG. 8G as 660.

FIG. 8H is an enlarged bottom plan view of a portion of a solar cell shown in FIG. 8G showing interconnect element of 600 FIG. 6 after being reworked by welding of the second set of three pairs of parallel apertures to the adjacent solar cell. Specifically, member 640 has been welded at weld points 641, 642, and 643 using the second set of three pairs of parallel apertures 641a/641b, 642a/642b, and 643a/643b, and member 650 has been welded at weld points 644, 645, and 646 using the second set of three pairs of parallel apertures 644a/644b, 645a/646b, and 646a/646b of member 650.

Figure 8I:
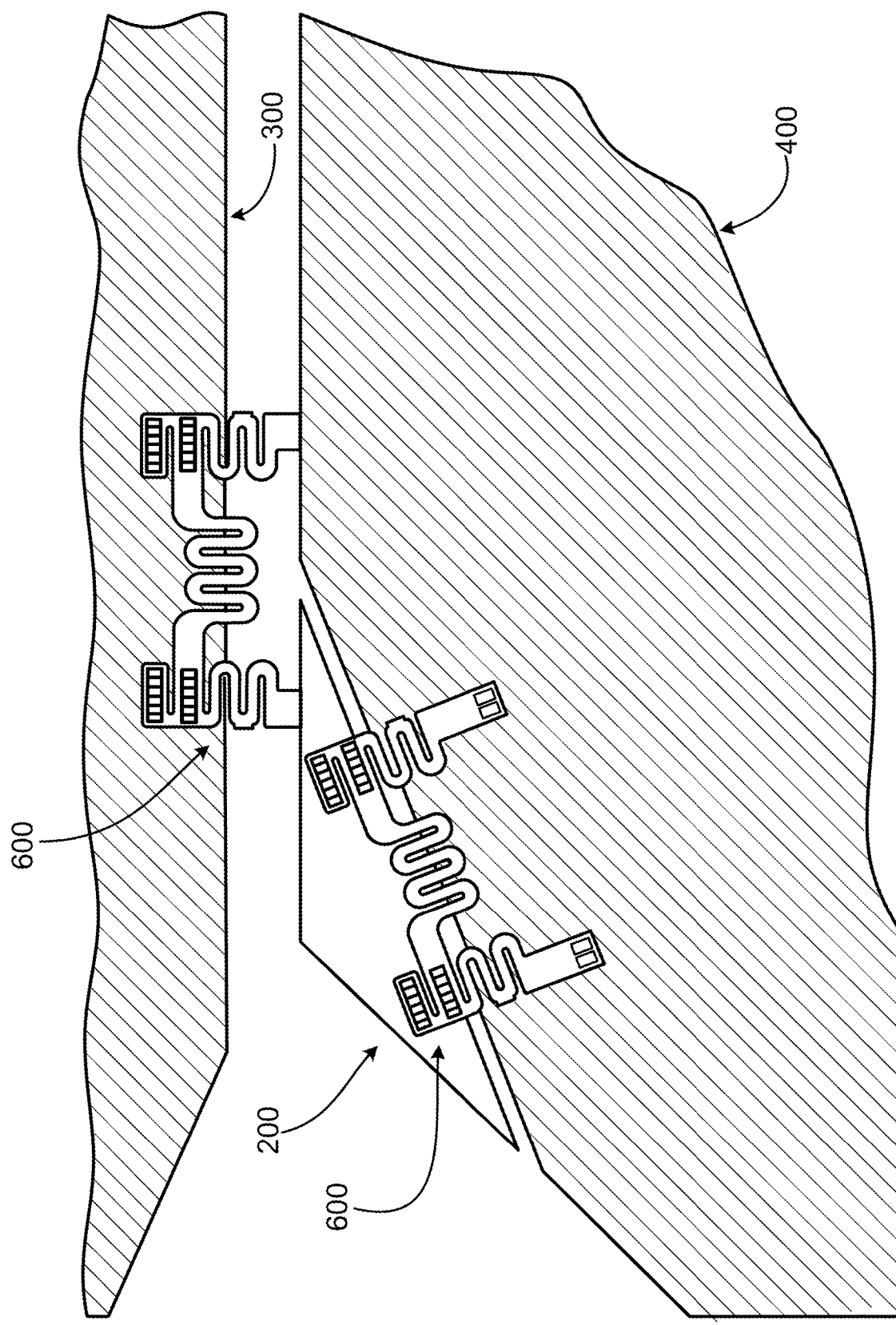
FIG. 8I is an enlarged bottom view of a portion of the solar cell shown in FIG. 8C further showing a second interconnect element of FIG. 6 mounted to the bypass diode.

FIG. 8I shows an implementation similar to the implementation of FIG. 8C, but includes a second interconnect element 600 of FIG. 6 (instead of the interconnect element of FIG. 1) mounted to the bypass diode 200.

Figure 9:
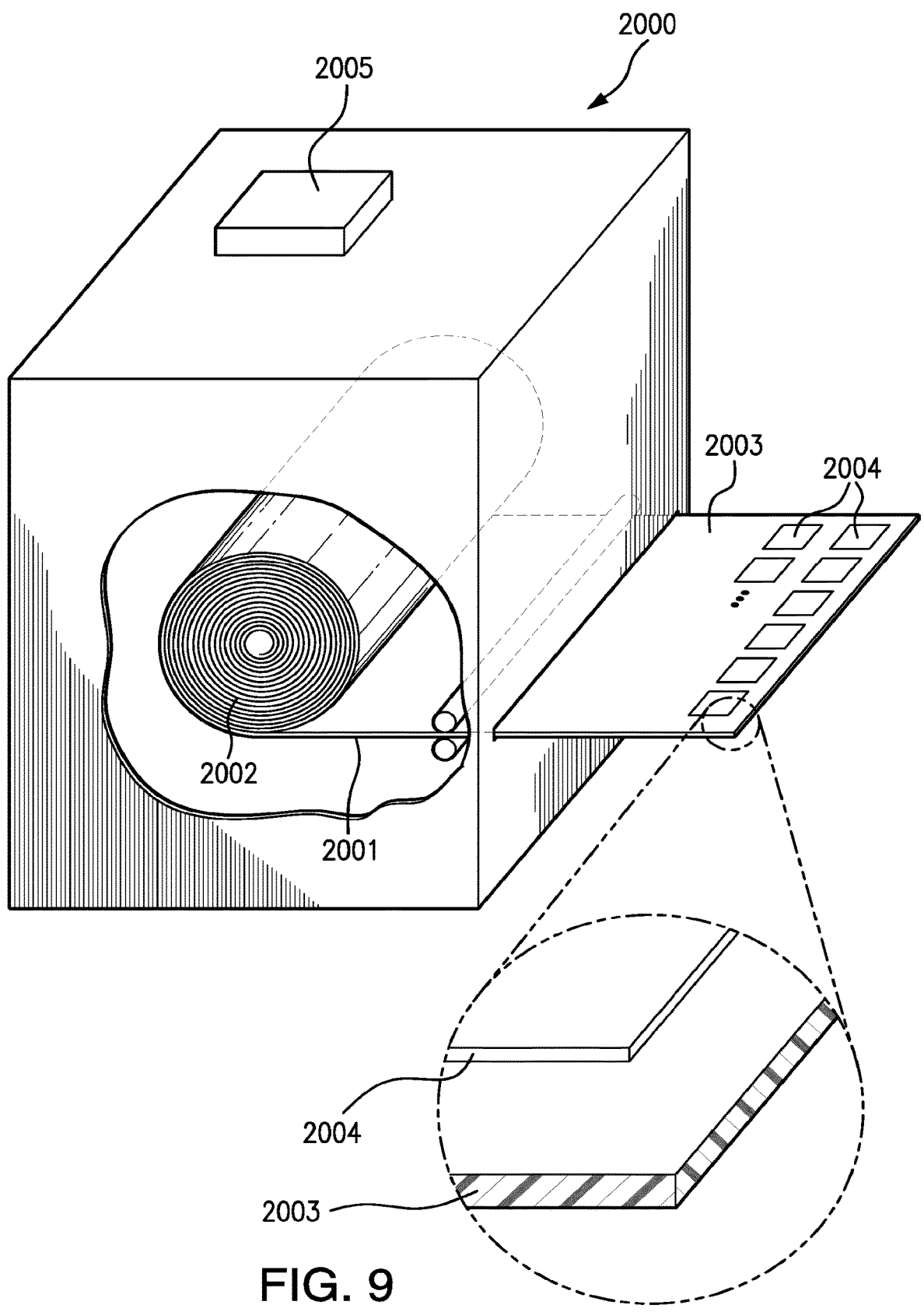
FIG. 9 is an embodiment of a space vehicle incorporating a photoelectric power system with roll-out deployment according to the present disclosure.

FIG. 9 is a highly simplified perspective view of an embodiment of a space vehicle incorporating a photoelectric power system with roll-out deployment according to the present disclosure. In this embodiment, the space vehicle 2000 incorporates an array 2001 of solar cells 2004 mounted on a deployable flexible sheet 2003 in which the solar cell array 2001 incorporates the solar cells or solar cell modules according to the present disclosure. In some embodiments, the modules may include a solar cell assembly comprising an optical concentrating element for producing optical concentration at least 5×; and a multijunction solar cell disposed beneath the optical concentrating element so that concentrated light impinges on the top surface of the solar cell, as more specifically set forth in U.S. patent application Ser. No. 14/663,741, filed Mar. 20, 2015, herein incorporated by reference.

The solar cell array 2001 may wrap around a mandrel 2002 prior to being deployed in space. The space vehicle 2000 includes a payload 2005 which is powered by the array 2001 of solar cell assemblies 2004.

It will be understood that each of the elements described above, or two or more together, also may find a useful application in other types of structures or constructions differing from the types of structures or constructions described above.

Although described embodiments of the present disclosure utilizes a triple junction solar cell, i.e. a vertical stack of three subcells, various aspects and features of the present disclosure can apply to semiconductor devices with stacks with fewer or greater number of subcells, i.e. two junction cells, four junction cells, five, six, seven junction cells, etc. In the case of four or more junction cells, the use of more than one metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claims. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A method of making an interconnection between a solar cell and an adjoining discrete bypass diode comprising:
    providing a solar cell comprising a top surface including a contact of a first polarity type disposed along a first peripheral edge thereof, and a rear surface including a contact of a second polarity type;
    providing a bypass diode comprising a top surface including a contact of a first polarity type, and a rear surface including a contact of a second polarity type;
    providing a metallic first interconnect element comprising a first end, a second opposing end, and one or more interconnect connecting portions attaching the first end of the interconnect element to the second opposing end of the interconnect element; wherein the first end comprises at least two first end members and one or more member connecting portions, each first end member having a respective first set of three pairs of parallel gap weld positions adapted for use in a parallel gap welding process for mounting the adjoining bypass diode to the interconnect element, and a respective second set of three pairs of parallel gap weld positions wherein the second set of weld positions is disposed parallel to and laterally spaced away from the first set of three pairs of weld positions and adapted for use, as an alternative to the first set, for mounting the adjoining bypass diode to the interconnect element;
    wherein the at least two first end members are attached to one another by the one or more member connecting portions; and wherein the second opposing end comprises at least two opposing end members, each opposing end member having a respective pair of parallel gap weld positions adapted for use in a parallel gap welding process for mounting the adjoining solar cell to the interconnect element;
    aligning the metallic first interconnect element with respect to the solar cell and the bypass diode so that the second opposing end of the interconnect element extends over a portion of the rear surface of the solar cell, and the first end of the interconnect element extends over a portion of the rear surface of the bypass diode;
    welding the first interconnect element to the rear surface of the bypass diode at a first weld position at a location of a first one of the pairs of parallel gap weld positions adapted for use in a parallel gap welding process at the first end of the interconnect element that extends over a portion of the rear surface of the bypass diode;
    welding the first interconnect element to the rear surface of the bypass diode at a second weld position at a location of a second one of the pairs of parallel gap weld positions adapted for use in a parallel gap welding process at the first end of the interconnect element that extends over a portion of the rear surface of the bypass diode;
    welding the first interconnect element to a portion of the rear surface of the solar cell at a first weld point at a location of a first one of the pairs of parallel gap weld positions adapted for use in a parallel gap welding process at the second opposing end of the interconnect element that extends over a portion of the rear surface of the solar cell; and
    welding the first interconnect element to a portion of the rear surface of the solar cell at a second weld point at a location of a second one of the pairs of parallel gap weld positions adapted for use in a parallel gap welding process at the second opposing end of the interconnect element that extends over a portion of the rear surface of the solar cell.

2. A method as defined in claim 1, further comprising providing a metallic second interconnect element and aligning it with respect to the solar cell and the bypass diode so that a first end of the second interconnect element extends over a portion of the top surface of the solar cell, and the opposing second end of the second interconnect element extends over a portion of the top surface of the bypass diode.

3. A method as defined in claim 2, further comprising welding the second interconnect element to the top surface of the solar cell at the location of a pair of parallel gap weld positions adapted for use in a parallel gap welding process at a first end portion of the second interconnect element that extends over a portion of the top surface of the solar cell.

4. A method as defined in claim 2, further comprising welding the second interconnect element to the top surface of the bypass diode at the location of a pair of parallel gap weld positions adapted for use in a parallel gap welding process at a second opposing end portion of the second interconnect element that extends over a portion of the top surface of the bypass diode.

5. A method as defined in claim 4, further comprising bonding a cover glass over the top surface of the solar cell, the bypass diode, and a first portion of the second interconnect element using an adhesive, wherein a second portion of the second interconnect element extends outside of the edge of the cover glass to allow the second interconnect element to be bonded to an adjoining solar cell.

6. A method as defined in claim 5, wherein the second portion of the second interconnect element includes a first bonding pad at one end corner of the second interconnect element, and a second bonding pad at a second opposing end corner of the second interconnect element.

7. A method as defined in claim 6, wherein the first bonding pad includes a pair of parallel gap weld points adapted for use in a parallel gap welding process at a first end corner of the second interconnect element to weld the second interconnect element to the adjoining solar cell, and the second bonding pad includes a pair of parallel gap weld points adapted for use in a parallel gap welding process at the second opposing end corner of the second interconnect element to weld the second interconnect element to the adjoining solar cell.

8. A method as defined in claim 6, wherein the second portion of the second interconnect element includes a third bonding pad adjacent to the first bonding pad and disposed at one end corner of the second interconnect element and including a pair of parallel gap weld points adapted for use in a parallel gap welding process to weld the second interconnect element to the adjoining solar cell, and a fourth bonding pad adjacent to the second bonding pad and disposed at the second opposing end corner of the second interconnect element and including a pair of parallel gap weld points adapted for use in a parallel gap welding process to weld the second interconnect element to the adjoining solar cell.

9. A method as defined in claim 1, wherein the one or more member connecting portions of the metallic first interconnect element to attach the two or more first end members to one another are curved.

10. A method as defined in claim 1, wherein the one or more interconnect connecting portions of the metallic first interconnect element to attach the first end of the interconnect element to the second end of the interconnect element are curved.

11. A method as defined in claim 1, wherein the metallic first interconnect element is composed of a nickel-cobalt ferrous alloy.

12. A method of making an interconnection between a solar cell and an adjoining discrete bypass diode comprising:
providing a solar cell comprising a top surface including a contact of a first polarity type disposed along a first peripheral edge thereof, and a rear surface including a contact of a second polarity type;
providing a bypass diode comprising a top surface including a contact of a first polarity type, and a rear surface including a contact of a second polarity type;
providing a metallic first interconnect element comprising: a first end comprising at least three members, each member having respective a pair of parallel gap weld positions for mounting the adjoining bypass diode; a second opposing end comprising at least two members, each member having a respective pair of parallel gap weld points for mounting the adjoining solar cell; and one or more interconnect connecting portions to attach the first end of the interconnect element to the second end of the interconnect element;
aligning the metallic first interconnect element with respect to the solar cell and the bypass diode so that the second opposing end of the interconnect element extends over a portion of the rear surface of the solar cell, and the first end of the interconnect element extends over a portion of the rear surface of the bypass diode;
welding the first interconnect element to the rear surface of the bypass diode at a first parallel gap weld point at a location of a first one of the pairs of parallel gap weld positions at the first end of the interconnect element that extends over the portion of the rear surface of the bypass diode;
welding the first interconnect element to the rear surface of the bypass diode at a second parallel weld point at a location of a second one of the pairs of parallel gap weld positions at the first end of the interconnect element that extends over the portion of the rear surface of the bypass diode;
welding the first interconnect element to the portion of the rear surface of the solar cell at a third parallel gap weld point at a location of a first one of the pairs of parallel gap weld positions at the second opposing end of the interconnect element that extends over the portion of the rear surface of the solar cell; and
welding the first interconnect element to the portion of the rear surface of the solar cell at a fourth parallel gap weld point at a location of a second one of the pairs of parallel gap weld positions at the second opposing end of the interconnect element that extends over the portion of the rear surface of the solar cell.

13. A method as defined in claim 12, wherein the first end of the metallic first interconnect element comprises at least four members, each member having a respective pair of parallel gap weld positions for mounting the adjoining discrete bypass diode.

14. A method as defined in claim 12, wherein the first end of the metallic first interconnect element comprises at least five members, each member having a respective pair of parallel gap weld positions for mounting the adjoining discrete bypass diode.

15. A method as defined in claim 12, wherein the one or more interconnect connecting portions of the metallic first interconnect element to attach the first end of the interconnect element to the second end of the interconnect element are curved.

16. A method as defined in claim 12, wherein the metallic first interconnect element is composed of a nickel-cobalt ferrous alloy.

17. A method of making an interconnection between a solar cell and an adjoining discrete bypass diode comprising:

providing a solar cell comprising a top surface including a contact of a first polarity type disposed along a first peripheral edge thereof, and a rear surface including a contact of a second polarity type;

providing a bypass diode comprising a top surface including a contact of a first polarity type, and a rear surface including a contact of a second polarity type;

providing a metallic first interconnect element composed of a nickel-cobalt ferrous alloy and comprising a first end, a second opposing end, and one or more curved interconnect connecting portions attaching the first end of the interconnect element to the second opposing end of the interconnect element;

wherein the first end comprises at least two first end members and one or more curved member connecting portions, each first end member having two sets of three pairs of parallel gap weld positions adapted for use in a parallel gap welding process for mounting the adjoining bypass diode to the interconnect element, wherein the at least two first end members are attached to one another by the one or more curved member connecting portions; and wherein the second opposing end comprises at least two opposing end members, each opposing end member having a pair of parallel gap weld positions adapted for use in a parallel gap welding process for mounting the adjoining solar cell to the interconnect element;

aligning the first interconnect element with respect to the solar cell and the bypass diode so that the second opposing end of the interconnect element extends over a portion of the rear surface of the solar cell, and the first end of the interconnect element extends over a portion of the rear surface of the bypass diode;

welding the first interconnect element to the rear surface of the bypass diode at a first weld position at a location of a first one of the pairs of parallel gap positions at the first end of the interconnect element that extends over the portion of the rear surface of the bypass diode;

welding the first interconnect element to the rear surface of the bypass diode at a second weld position at a location of a second one of the pairs of parallel gap weld positions at the first end of the interconnect element that extends over the portion of the rear surface of the bypass diode;

welding the first interconnect element to the portion of the rear surface of the solar cell at a first weld point at a location of a first one of the pairs of parallel gap weld positions at the second opposing end of the interconnect element that extends over the portion of the rear surface of the solar cell; and welding the first interconnect element to the portion of the rear surface of the solar cell at a second weld position at a location of a second one of the pairs of parallel gap weld positions at the second opposing end of the interconnect element that extends over the portion of the rear surface of the solar cell.

* * * * *